United States Patent
Park et al.

(10) Patent No.: US 11,705,376 B2
(45) Date of Patent: *Jul. 18, 2023

(54) SEMICONDUCTOR CHIP INCLUDING CHIP PAD, REDISTRIBUTION WIRING TEST PAD, AND REDISTRIBUTION WIRING CONNECTION PAD

(71) Applicant: SAMSUNG ELECTRONICS CO., LTD., Suwon-si (KR)

(72) Inventors: Myeong-soon Park, Goyang-si (KR); Hyun-Soo Chung, Hwaseong-si (KR); Chan-Ho Lee, Gwangmyeong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/520,854

(22) Filed: Nov. 8, 2021

(65) Prior Publication Data

US 2022/0059417 A1     Feb. 24, 2022

Related U.S. Application Data

(63) Continuation of application No. 16/868,209, filed on May 6, 2020, now Pat. No. 11,189,535, which is a
(Continued)

(30) Foreign Application Priority Data

Jul. 9, 2015   (KR) .......................... 10-2015-0097867

(51) Int. Cl.
*H01L 23/48*     (2006.01)
*H01L 21/66*     (2006.01)
*G11C 29/12*     (2006.01)

(52) U.S. Cl.
CPC .......... *H01L 22/32* (2013.01); *G11C 29/1201* (2013.01); *H01L 2224/16145* (2013.01);
(Continued)

(58) Field of Classification Search
CPC ........... H01L 22/32; H01L 2224/16145; H01L 2224/16225; H01L 2224/48091;
(Continued)

(56) References Cited

U.S. PATENT DOCUMENTS 5,554,940 A    9/1996   Hubacher
5,930,196 A    7/1999   Yim
(Continued)

FOREIGN PATENT DOCUMENTS

JP          08340029 A      12/1996
JP     20020760075 A       3/2002
(Continued)

OTHER PUBLICATIONS

Communication dated Apr. 29, 2020, issued by the State Intellectual Property Office of P.R. China in counterpart Chinese Application No. 201610542639.1.
(Continued)

*Primary Examiner* — Samuel Park
(74) *Attorney, Agent, or Firm* — Sughrue Mion, PLLC

(57) ABSTRACT

A semiconductor chip is disclosed that includes a chip pad disposed in a first region of a chip body, a redistribution wiring test pad disposed in the first region of the chip body spaced apart from the chip pad and connected to the chip pad through a redistribution wiring structure, and a redistribution wiring connection pad disposed in the first region of the chip body or a second region of the chip body and connected to the chip pad through the redistribution wiring structure.

20 Claims, 26 Drawing Sheets

Related U.S. Application Data continuation of application No. 15/175,017, filed on Jun. 6, 2016, now Pat. No. 10,840,159.

(52) U.S. Cl.
CPC ............... *H01L 2224/16225* (2013.01); *H01L 2224/48091* (2013.01); *H01L 2224/48227* (2013.01); *H01L 2924/15311* (2013.01); *H01L 2924/181* (2013.01)

(58) Field of Classification Search
CPC . H01L 2224/48227; H01L 2924/15311; H01L 2924/181; H01L 23/498; G11C 29/1201
See application file for complete search history.

(56) References Cited

U.S. PATENT DOCUMENTS

| | | | |
|---|---|---|---|
| 6,528,735 B1 | 3/2003 | Bhatia et al. | |
| 7,855,461 B2 | 12/2010 | Kuo et al. | |
| 8,797,057 B2 | 8/2014 | Wu et al. | |
| 2003/0032263 A1 | 2/2003 | Nagao et al. | |
| 2005/0248011 A1 | 11/2005 | Jung et al. | |
| 2009/0302484 A1 | 12/2009 | Lee | |
| 2010/0044847 A1 | 2/2010 | Lee | |
| 2011/0093235 A1 | 4/2011 | Oh et al. | |
| 2012/0002456 A1 | 1/2012 | Oh | |
| 2012/0051113 A1 | 3/2012 | Choi et al. | |
| 2013/0062761 A1 | 3/2013 | Lin et al. | |
| 2014/0014958 A1 | 1/2014 | Oh et al. | |
| 2014/0239514 A1* | 8/2014 | Haba | H01L 23/49816 257/778 |
| 2015/0048500 A1 | 2/2015 | Yu et al. | |
| 2015/0076698 A1 | 3/2015 | Lin et al. | |
| 2015/0263005 A1 | 9/2015 | Zhao et al. | |
| 2016/0084887 A1 | 3/2016 | Beer et al. | |
| 2016/0172345 A1* | 6/2016 | Chen | H01L 23/3121 257/777 |
| 2016/0276173 A1* | 9/2016 | Song | H01L 23/49822 |

FOREIGN PATENT DOCUMENTS

| | | |
|---|---|---|
| JP | 2003124274 A | 4/2003 |
| JP | 2011100898 A | 5/2011 |
| KR | 20010002486 A | 1/2001 |
| KR | 100754086 A | 8/2007 |
| KR | 10-1006521 B1 | 1/2011 |
| KR | 1020140008174 A | 1/2014 |
| WO | 2015/003553 A1 | 1/2015 |

OTHER PUBLICATIONS

Communication dated Sep. 14, 2021 issued by the Korean Intellectual Property Office in application No. 10-2015-0097867.

* cited by examiner

SEMICONDUCTOR CHIP INCLUDING CHIP PAD, REDISTRIBUTION WIRING TEST PAD, AND REDISTRIBUTION WIRING CONNECTION PAD

CROSS-REFERENCE TO RELATED APPLICATIONS

This Application is a Continuation of U.S. patent application Ser. No. 16/868,209, filed on May 6, 2020, which is a Continuation of U.S. patent application Ser. No. 15/175,017, filed Jun. 6, 2016, which claims the benefit of Korean Patent Application No. 10-2015-0097867, filed on Jul. 9, 2015, in the Korean Intellectual Properly Office, the disclosures of which are incorporated herein in their entireties by reference.

BACKGROUND

The inventive concept relates to a semiconductor chip, and more particularly, to a semiconductor chip including a chip pad, a redistribution wiring test pad, and a redistribution wiring connection pad.

Semiconductor chips are progressively miniaturized, multi-functioned, and large-scaled, and need to have high reliability. Whether a semiconductor chip is good or defective is determined by tested using a connection pad during manufacturing, and the semiconductor chip may be electrically connected to an external device (or an external board) through the connection pad. In this case, since the connection pad cannot be disposed in some locations, a degree of freedom of a chip design is reduced, and when testing the semiconductor chip by using the connection pad, physical stress may be applied to an internal circuit element, such as a memory cell array.

SUMMARY

The inventive concept provides a semiconductor chip in which a redistribution wiring test pad and a redistribution wiring connection pad into which a connection pad is divided are disposed on a chip body, and thus, a degree of freedom of a chip design is enhanced, thereby miniaturizing a chip.

According to an aspect of the inventive concept, there is provided a semiconductor chip in which an internal circuit element, such as a memory cell array, is not disposed on a chip body under a redistribution wiring test pad, and thus, physical stress of the internal circuit element may be reduced, thereby enhancing reliability.

According to another aspect of the inventive concept, there is provided a semiconductor chip including: a chip pad disposed in a first region of a chip body; a redistribution wiring test pad disposed in the first region of the chip body spaced apart from the chip pad, and connected to the chip pad through a redistribution wiring structure; and a redistribution wiring connection pad disposed in the first region of the chip body or a second region of the chip body and connected to the chip pad through the redistribution wiring structure.

The first region of the chip body may be a peripheral circuit region including a control circuit that controls a memory cell array, and the second region of the chip body may be a core region including the memory cell array.

An internal circuit element including a memory cell array may not be disposed to overlap a lower portion of the redistribution wiring test pad in the first region of the chip body.

The memory cell array may be an integrated circuit element that includes a transistor, a capacitor, or a combination thereof.

An internal circuit element including a memory cell array may be disposed to overlap a lower portion of the redistribution wiring connection pad in the second region of the chip body.

The redistribution wiring structure may include a redistribution wiring via connected to the chip pad and a redistribution wiring layer connected to the redistribution wiring via.

The redistribution wiring structure may extend in a first direction from the chip pad on the chip body and may be electrically connected to the redistribution wiring test pad, and the redistribution wiring structure may extend in a second direction, which is substantially opposite to the first direction, from the chip pad on the chip body and may be electrically connected to the redistribution wiring connection pad.

The chip pad and the redistribution wiring test pad may be disposed in a central portion of the chip body.

The chip pad and the redistribution wiring test pad may be disposed in a near-edge portion of the chip body.

The redistribution wiring connection pad may be disposed in a central portion, a middle portion, or a near-edge portion of the chip body.

The chip pad may be one of a plurality of chip pads, and the plurality of chip pads are arranged spaced apart from each other, the redistribution wiring connection pad may be one of a plurality of redistribution wiring connection pads, and the plurality of redistribution wiring connection pads are arranged spaced apart from each other, and the redistribution wiring test pad may be one of a plurality of redistribution wiring test pads, and the plurality of redistribution wiring test pads are arranged spaced apart from each other.

The redistribution wiring structure may be disposed to electrically connect at least one of the plurality of chip pads to at least one of the plurality of redistribution wiring connection pads.

The redistribution wiring structure may be disposed to electrically connect at least one of the plurality of chip pads to at least one of the plurality of redistribution wiring test pads.

The at least one chip pad may be further provided in the second region of the chip body.

The redistribution wiring connection pad may be disposed spaced apart from the chip pad and the redistribution wiring test pad on the chip body.

According to another aspect of the inventive concept, there is provided a semiconductor chip including: a chip pad disposed on a chip body; a first passivation layer disposed on the chip body, the first passivation layer including a via hole that exposes the chip pad; a redistribution wiring via disposed in the via hole and electrically connected to the chip pad; a redistribution wiring layer disposed on the chip body that is electrically connected to the redistribution wiring via on the chip body; a second passivation layer disposed on the redistribution wiring layer, the second passivation layer including a test hole that exposes the redistribution wiring layer in a first region of the chip body, and a connection hole that exposes the redistribution wiring layer in the first region or a second region of the chip body that differs from the first region; a redistribution wiring test pad provided on the redistribution wiring layer exposed by the test hole; and a redistribution wiring connection pad provided on the redistribution wiring layer exposed by the connection hole.

The first region may be a peripheral circuit region including a control circuit that controls a memory cell array, and the second region may be a core region including the memory cell array.

An internal circuit element including a memory cell array may not be disposed in the first region of the chip body under the redistribution wiring test pad and may be disposed in the second region of the chip body under the redistribution wiring connection pad.

The redistribution wiring via and the redistribution wiring layer may be provided as one structure.

The redistribution wiring layer may extend from a region, where the chip pad is provided, to a region where the redistribution wiring test pad and the redistribution wiring connection pad are provided.

The chip pad may be provided in the first region or the second region of the chip body.

According to another aspect of the inventive concept, there is provided a semiconductor chip including: a chip pad disposed in at least one peripheral circuit region provided in a chip body; a redistribution wiring test pad disposed in the peripheral circuit region and connected to the chip pad through a redistribution wiring structure, the redistribution wiring test pad being spaced apart from the chip pad; and a redistribution wiring connection pad disposed in the peripheral circuit region or at least one of a plurality of core regions provided in the chip body, and connected to the chip pad through the redistribution wiring structure, the redistribution wiring connection pad being spaced apart from the chip pad and the redistribution wiring test pad.

The redistribution wiring test pad may be provided between the plurality of core regions.

The chip pad and the redistribution wiring test pad may be provided in a central portion of the chip body between the plurality of core regions.

The chip pad, the redistribution wiring test pad, and the redistribution wiring connection pad may be provided in a central portion of the chip body between the plurality of core regions.

The chip pad and the redistribution wiring test pad may be provided in a near-edge portion of the chip body.

The redistribution wiring connection pad may be provided in a near-edge portion or a central portion of the chip body.

The chip pad is provided in a near-edge portion or a central portion of the chip body.

According to another aspect of the inventive concept, there is provided a semiconductor chip including: a plurality of core regions disposed in a chip body to be spaced apart from each other, each of the plurality of core regions including a memory cell array; a peripheral circuit region disposed in a portion of the chip body except the plurality of core regions, the peripheral circuit region including a control circuit that controls the memory cell array included in each of the plurality of core regions; a chip pad disposed in the peripheral circuit region; a redistribution wiring test pad disposed in the peripheral circuit region spaced apart from the chip pad, and connected to the chip pad through a redistribution wiring structure; and a redistribution wiring connection pad disposed in each of the plurality of core regions or the peripheral circuit region spaced apart from the chip pad, and connected to the chip pad through the redistribution wiring structure.

Each of the plurality of core regions may include a plurality of sub-core regions disposed in the chip body, and the peripheral circuit region may be disposed in a central portion of the chip body between the plurality of sub-core regions.

Each of the plurality of core regions may include a plurality of sub-core regions disposed in the chip body, and the peripheral circuit region may be disposed in one near-edge portion or both near-edge portions of the chip body.

An internal circuit element including a memory cell array may not be disposed to overlap a lower portion of the redistribution wiring test pad in the peripheral circuit region of the chip body and may be disposed to overlap a lower portion of the redistribution wiring connection pad between the plurality of core regions of the chip body.

The internal circuit element including the memory cell array may be a transistor, a capacitor, or a combination thereof.

The redistribution wiring structure may include a redistribution wiring via connected to the chip pad and a redistribution wiring layer connected to the redistribution wiring via.

The chip pad, the redistribution wiring test pad, and the redistribution wiring connection pad may be disposed in a central portion of the chip body.

The chip pad, the redistribution wiring test pad, and the redistribution wiring connection pad are disposed in a near-edge portion of the chip body.

According to another embodiment, a semiconductor chip comprises: at least one chip pad disposed on a chip body; at least one redistribution wiring test pad disposed in a first region of the chip body, each redistribution wiring test pad being spaced apart from a corresponding chip pad; at least one redistribution wiring connection pad disposed in the first region of the chip body or a second region of the chip body, the second region being different from the first region, each redistribution wiring connection pad being spaced apart from a corresponding chip pad; and at least one redistribution wiring structure, each redistribution wiring structure connected to a chip pad, the redistribution wiring test pad corresponding to the chip pad and the redistribution wiring connection pad corresponding to the chip pad. In one embodiment, the at least one chip pad is disposed in the first region of the chip body. In an alternative embodiment, the at least one chip pad is disposed in the second region of the chip body.

The semiconductor chip may further comprise: at least one memory cell array disposed in the second region of the chip body; and a control circuit disposed in the first region of the chip body, the control circuit to control the at least one memory cell array. In one embodiment, the control circuit does not overlap a lower portion of at least one redistribution wiring test pad. In another embodiment, the memory cell array does not overlap a lower portion of at least one redistribution wiring test pad.

At least one of the at least one redistribution wiring structure extends in a first direction from the corresponding chip pad to the corresponding wiring distribution test pad, and extends in a second direction from the corresponding chip pad to the corresponding redistribution wiring connection pad, the first direction being substantially opposite the second direction.

The first region of the chip body comprises a peripheral region of the chip body, and the second region of the chip body comprises a central region of the chip body.

The semiconductor chip may further comprise a first passivation layer disposed on the chip body, the first passivation layer comprising a via hole that exposes the at least one chip pad; a redistribution wiring via disposed in the via hole and electrically connected to the chip pad; a redistribution wiring layer on the chip body that is electrically connected to the redistribution wiring via; and a second passivation layer disposed on the redistribution wiring layer, the second passivation layer including a test hole that exposes a portion of the redistribution wiring layer in the first region of the chip body and a connection hole that exposes the redistribution wiring layer in a first region or a second region of the chip body that differs from the first region, wherein the redistribution wiring test pad corresponding to the at least one chip pad provided on the redistribution wiring layer exposed by the test hole; and wherein the redistribution wiring connection pad corresponding to the at least one chip pad provided on the redistribution wiring layer exposed by the connection hole.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
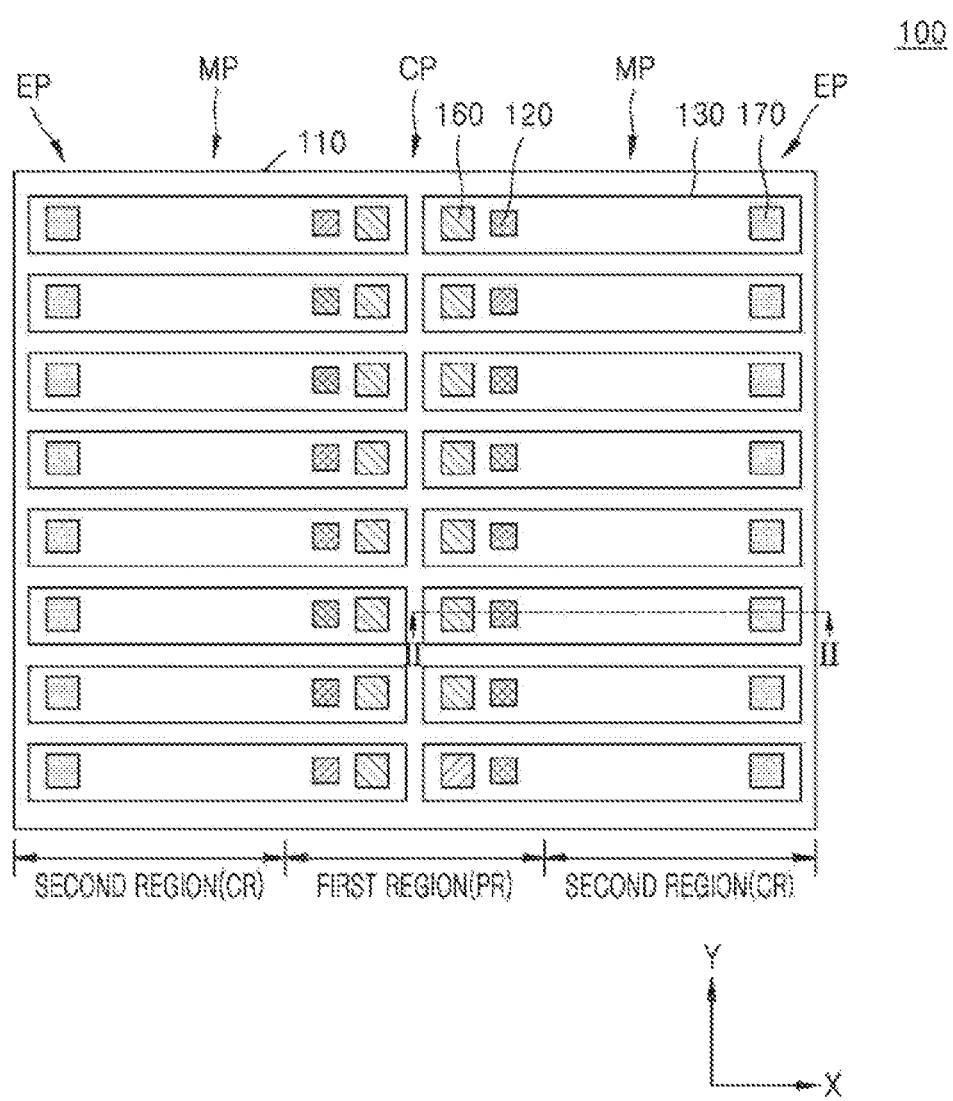
FIG. 1 is a plan view illustrating a main portion of a semiconductor chip according to an exemplary embodiment.

As used herein, the term "and/or" includes any and all combinations of one or more of the associated listed items. Expressions such as "at least one of" when preceding a list of elements, modify the entire list of elements and do not modify the individual elements of the list.

Hereinafter, exemplary embodiments will be described in detail with reference to the accompanying drawings.

Embodiments of the inventive concept are provided for fully conveying the concept of the inventive concept to those skilled in the art. The inventive concept may be embodied in many different forms and should not be construed as being limited to the embodiments set forth herein; rather, these embodiments are provided so that this disclosure may be thorough and complete, and may fully convey the concept of the inventive concept to those skilled in the art. Structures or sizes of elements illustrated in the accompanying drawings may be exaggerated for convenience of description and for clarity of the specification.

It will be understood that when an element, such as a layer, a region, or a substrate, is referred to as being "on," "connected to" or "coupled to" another element, the element may be directly on, connected or coupled to the other element or intervening elements may be present. In contrast, when an element is referred to as being "directly on," "directly connected to" or "directly coupled to" another element or layer, there are no intervening elements or layers present. Like reference numerals refer to like elements throughout.

In the specification, though terms like a first and a second are used to describe various members, components, regions, layers, and/or portions in various embodiments of the inventive concept, the members, components, regions, layers, and/or portions are not limited to these terms. These terms do not denote a specific sequence, top and bottom, or merit and demerit, and are used only to differentiate one member, component, region, layer, or portion from another one. Therefore, a member, a component, a region, a layer, or a portion referred to as a first member, a first component, a first region, a first layer, or a first portion in an embodiment may be referred to as a second member, a second component, a second region, a second layer, or a second portion in another embodiment.

Spatially relative terms, such as "above," "upper," "beneath," "below," "lower," and the like, may be used herein for ease of description to describe a relationship of one element or feature to another elements) or feature(s) as illustrated in the figures. It should be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "above" may encompass both an orientation of above and below. The device may be otherwise oriented (rotated 90 degrees or at other orientations) and the spatially relative descriptors used herein interpreted accordingly.

The terms used in this application, only certain embodiments have been used to describe, is not intended to limit the present embodiments. In the following description, the technical terms are used only for explain a specific exemplary embodiment while not limiting the present embodiments. The terms of a singular form may include plural forms unless referred to the contrary. The meaning of "include," "comprise," "including," or "comprising," specifies a property, a region, a fixed number, a step, a process, an element and/or a component but does not exclude other properties, regions, fixed numbers, steps, processes, elements and/or components.

Exemplary embodiments disclosed herein will be described with reference to the drawings schematically illustrating ideal embodiments. In the accompanying drawings, for example, modifications of an illustrated shape may be expected according to manufacturing technology and/or a process difference. Therefore, embodiments of the inventive concept should not be construed as being limited to a specific shape of a region illustrated in the drawing, and for example, should include a shape change caused in a manufacturing process. Exemplary embodiments may be implemented as one, and moreover, exemplary embodiments may be implemented by a combination of one or more.

Figure 2:
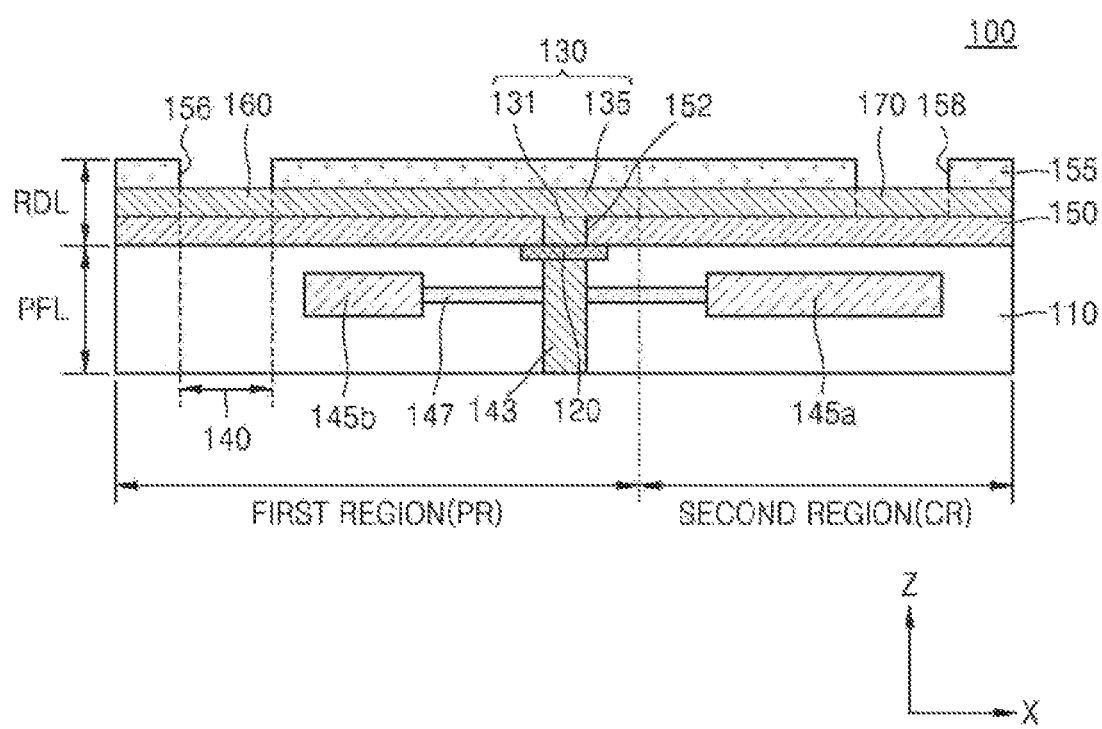
FIG. 2 is a cross-sectional view taken along line II-II of FIG. 1.

FIG. 1 is a plan view illustrating a main portion of a semiconductor chip according to an exemplary embodiment. FIG. 2 is a cross-sectional view taken along line II-II of FIG. 1.

In detail, in FIGS. 1 and 2, an X-axis direction may indicate a column direction (i.e., left or right in FIGS. 1 and 2), a Y-axis direction may indicate a lateral direction (i.e., up or down in FIGS. 1 and 2), and a Z-axis direction may indicate an up and down direction (i.e., in or out of the page in FIGS. 1 and 2). A chip (a semiconductor chip) 100 may include a chip pad 120 that is disposed on a chip body 110, a redistribution wiring test pad 160 that is electrically connected to the chip pad 120 by a redistribution wiring (interconnection) structure 130, and a redistribution wiring connection pad 170 that is electrically connected to the chip pad 120 by the redistribution wiring structure 130.

The chip body 110 may be a semiconductor substrate, for example, a silicon substrate. The chip body 110 may depict a wafer state. For example, the chip body 110 may depict states previous to or subsequent to a sawing process that may be included in a semiconductor manufacturing process.

The chip body 110 may include a first region PR and a second region CR. The first region PR may be a peripheral circuit region that controls the second region CR. The second region CR may be a core region that performs a main function of the semiconductor chip 100, for example, a data storing function. The second region CR may be a core region that includes a memory cell array storing data. In the present specification, the core region CR may be a generic name for a region including a memory cell array in the chip body 110. The first region PR may be a peripheral circuit region that includes a control circuit controlling the memory cell array. In the present specification, the peripheral circuit region may be a generic name for a region that does not include the core region.

The chip body 110 may include a chip via 143, a plurality of internal circuit elements 145a and 145b, and an internal wiring 147. The chip via 143 may be electrically connected to the chip pad 120 and the internal circuit elements 145a and 145b. The chip via 143 may be directly or indirectly brought in contact with or connected to the internal circuit elements 145a and 145b. The chip via 143 may pass vertically through the chip body 110. The chip via 143 may be a silicon through-via. The chip via 143 may pass vertically through the chip body 110 and may be exposed to a surface (i.e., a lower surface in the drawing) of the chip body 110. The chip via 143 and the internal wiring 147 may each be formed of a conductive material, such as metal or the like, and more particularly, may each be formed of aluminium, copper, gold, and/or the like.

The internal circuit element 145a disposed in the second region CR may be a memory cell array. The memory cell array may be a highly integrated circuit element that includes a transistor (not shown), a capacitor (not shown), and a combination thereof. The internal circuit element 145b disposed in the first region PR may be a control circuit or a control transistor (not shown) that controls the second region CR.

The chip pad 120 may be disposed on the chip body 110. The upper surface or the entirety of the chip pad 120 may be formed of a conductive material, such as metal or the like, and more particularly, may be formed of aluminium, copper, gold, and/or the like. The chip pad 120 may be formed in a rectangular shape. The chip pad 120 may be disposed in the first region PR. Depending on the case, the chip pad 120 may be disposed in the second region CR. The chip pad 120 may be electrically connected to the internal circuit elements 145a and 145b through the internal wiring 147. The chip pad 120 may be provided through a chip pad forming level PFL that includes the chip via 143, the internal circuit elements 145a and 145b, and the internal wiring 147 in the chip body 110. The chip pad 120 may protrude to an upper surface of the chip body 110.

The chip pad 120 may be disposed at a central portion CP of the chip body 110. The chip pad 120 may be arranged with a plurality of chip pads that are arranged spaced apart from each other in the lateral direction (the Y-axis direction). In FIG. 1, it is illustrated that a plurality of the chip pads 120 are arranged in two rows in the lateral direction (the Y-axis direction) at the central portion CP of the chip body 110. The plurality of chip pads 120 may be arranged in the column direction (the X-axis direction) or the lateral direction (the Y-axis direction) on the chip body 110. In FIG. 1, the chip pads 120 are primarily illustrated as being arranged in the lateral direction, but this is merely for easily understanding the technical spirit of the inventive concept. In the present specification, although not shown in the drawings, it may be understood that the technical spirit of the inventive concept includes various arrangements of the chip pads 120.

A connection pad (not shown), which is connected to an external device (or an external board, a wiring board, or the like) in connection with the chip pad 120, may be disposed in a desired region of the chip body 110 through a redistribution wiring (interconnection) process. A degree of freedom of a chip design may be increased by using the redistribution wiring process. The chip pad 120 may be electrically connected to the redistribution wiring structure 130 through the redistribution wiring process.

It is illustrated that the redistribution wiring structure 130 electrically connects one of the chip pads 120 to one of the redistribution wiring test pads 160 and one of the redistribution wiring connection pads 170 in the column direction (the X-axis direction). Alternatively, the redistribution wiring structure 130 may electrically connect two of the chip pads 120 to two of the redistribution wiring test pads 160 and two of the redistribution wiring connection pads 170 in the column direction depending on the case.

The redistribution wiring structure 130 may include a redistribution wiring (interconnection) via 131 disposed on the chip pad 120 and a redistribution wiring (interconnection) layer 135 connected to the redistribution wiring via 131. Each of the redistribution wiring vias 131 and the redistribution wiring layers 135 may be a conductive layer electrically connected to the chip pad 120. The redistribution wiring via 131 and the redistribution wiring layer 135 may each be formed of a metal layer for example, an aluminium layer, a copper layer, a gold layer, or the like. The redistribution wiring via 131 may be disposed in a via hole 152 that is formed in a first passivation layer 150 on the chip body 110. The redistribution wiring via 131 may be insulated from another redistribution wiring via (not shown) by the first passivation layer 150. The first passivation layer 150 may be formed of silicon oxide, silicon nitride, and/or the like.

The redistribution wiring layer 135 may be formed for rewiring of the chip pad 120. A second passivation layer 155, which includes a test hole 156 and a connection hole 158 that each expose a portion of the redistribution wiring layer 135, may be formed on the redistribution wiring layer 135. The second passivation layer 155 may be formed of silicon oxide, silicon nitride, and/or the like.

Therefore, the redistribution wiring layer 135 may include the redistribution wiring test pad 160 exposed by the test hole 156 and the redistribution wiring connection pad 170 exposed by the connection hole 158. The test pad 160 may be used in a testing operation of the semiconductor chip 100. The redistribution wiring connection pad 170 may be used in an operation that electrically connects the semiconductor chip 100 to an external device through a connection terminal (for example, a solder ball, a solder bump, or the like).

The redistribution wiring test pad 160 may be disposed at the central portion CP of the chip body 110. The redistribution wiring test pad 160 may be provided in plurality, and the plurality of redistribution wiring test pads 160 may be arranged spaced apart from each other in the lateral direction (the X-axis direction). The redistribution wiring test pad 160 may be disposed in the first region PR. The internal circuit element 145*a* including the memory cell array may not be disposed below a lower portion 140 of the redistribution wiring test pad 160 so that the internal circuit element 145*a* overlaps the lower portion 140. The highly integrated internal circuit element 145*a* including the memory cell array that includes a transistor (not shown), a capacitor (not shown), and a combination thereof may not be disposed at the lower portion 140 of the redistribution wiring test pad 160.

Therefore, physical stress is not applied to the internal circuit element 145*a* including the memory cell array in a testing operation of the semiconductor chip 100, and thus, the reliability of the semiconductor chip 100 may be enhanced. The internal circuit element 145*b* including the control circuit or the control transistor (not shown) may be disposed under the redistribution wiring test pad 160 depending on the case.

The redistribution wiring connection pad 170 may be disposed in a near-edge portion (or an edge portion) EP of the chip body 110. The redistribution wiring connection pad 170 may be disposed in the second region CR. The redistribution wiring connection pad 170 may be provided in plurality, and the plurality of redistribution wiring connection pads 170 may be spaced apart from each other in the lateral direction (the Y-axis direction). The internal circuit element 145*a* including the memory cell array may be disposed under the redistribution wiring connection pad 170 to overlap the redistribution wiring connection pad 170. The redistribution wiring connection pad 170 may be disposed in the second region CR, but depending on the case, the redistribution wiring connection pad 170 may be disposed in the first region PR.

The redistribution wiring structure 130 may be one structure that includes the redistribution wiring via 131 and the redistribution wiring layer 135. The redistribution wiring structure 130 may electrically connect the chip pad 120 to the redistribution wiring test pad 160 via a middle portion MP of the chip body 110. In the present specification, the middle portion MP of the chip body 110 may be a portion between the central portion CP of the chip body 110 and the near-edge portion EP of the chip body 110. Also, the redistribution wiring structure 130 may electrically connect the chip pad 120 to the redistribution wiring connection pad 170.

The redistribution wiring structure 130 may extend in a first direction (for example, towards the left along the X-direction in FIG. 2) from the chip pad 120 on the chip body 110 and may be electrically connected to the redistribution wiring test pad 160. The redistribution wiring structure 130 may extend in a second direction (for example, towards the right along the X-direction in FIG. 2), which is opposite or substantially opposite to the first direction, from the chip pad 120 on the chip body 110 and may be electrically connected to the redistribution wiring connection pad 170.

The first passivation layer 150, the second passivation layer 155, the redistribution wiring structure 130, the redistribution wiring test pad 160, and the redistribution wiring connection pad 170 may be formed on the chip pad 120 by a redistribution wiring forming level RDL. The redistribution wiring test pad 160 and the redistribution wiring connection pad 170 may be disposed at various positions on the chip body 110 through the redistribution wiring forming level RDL.

The redistribution wiring test pad 160 may be disposed at the central portion CP of the chip body 110. In FIG. 1, it is illustrated that the plurality of redistribution wiring test pads 160 are arranged in two rows in the lateral direction (the Y-axis direction) at the central portion CP of the chip body 110. The redistribution wiring test pads 160 may be arranged in the column direction (the X-axis direction) or the lateral direction (the Y-axis direction) on the chip body 110.

The redistribution wiring connection pad 170 may be disposed at the near-edge portion EP of the chip body 110. In FIG. 1, it is illustrated that the plurality of redistribution wiring connection pads 170 may be arranged in one row in the lateral direction (the Y-axis direction) at the near-edge portion EP of the chip body 110. The redistribution wiring connection pads 170 may be arranged in the column direction (the X-axis direction) or the lateral direction (the Y-axis direction) on the chip body 110.

In FIG. 1, the redistribution wiring test pads 160 and the redistribution wiring connection pads 170 are illustrated as being arranged in the lateral direction, but this is merely for easily understanding the technical spirit of the inventive concept. In the present specification, although not shown in the drawings, it may be understood that the technical spirit of the inventive concept includes various arrangement forms of the redistribution wiring test pads 160 and the redistribution wiring connection pads 170.

As described above, physical stress is not applied to the internal circuit element 145*a* including the memory cell array in a testing operation of the semiconductor chip 100, and thus, the reliability of the semiconductor chip 100 may be enhanced. Furthermore, in the semiconductor chip 100 according to an exemplary embodiment, arrangement of the chip pad 120 and the redistribution wiring test pad 160 and the redistribution wiring connection pad 170, which are connected to the chip pad 120, may be freely changed, and thus, a degree of freedom of a chip design may be enhanced, thereby miniaturizing a chip. In the present specification, the chip pad 120 may be referred to as an original pad.

Figure 3:
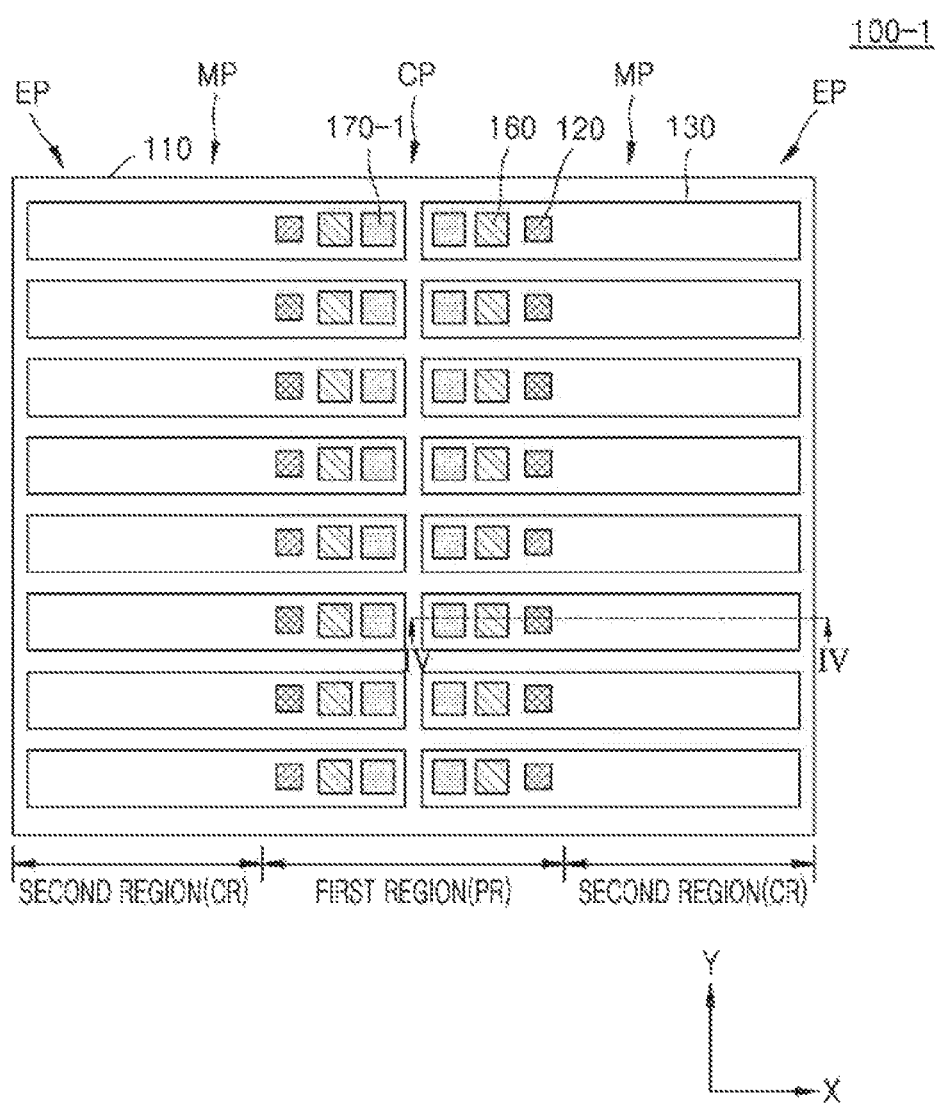
FIG. 3 is a plan view illustrating a main portion of a semiconductor chip according to an exemplary embodiment.
Figure 4:
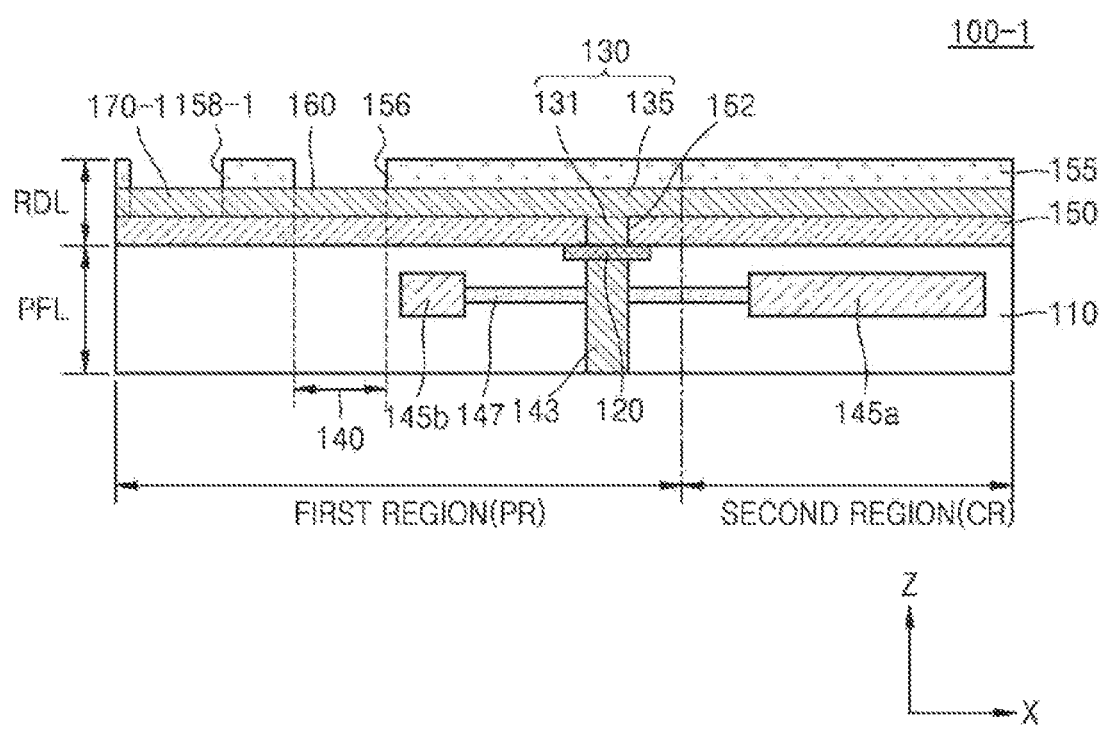
FIG. 4 is a cross-sectional view taken along line IV-IV of FIG. 3.

FIG. 3 is a plan view illustrating a main portion of a semiconductor chip 100-1 according to an exemplary embodiment. FIG. 4 is a cross-sectional view taken along line IV-IV of FIG. 3.

In detail, the semiconductor chip 100-1 of FIGS. 3 and 4 may be similar to the semiconductor chip 100 of FIGS. 1 and 2, except that a redistribution wiring connection pad 170-1 is disposed in a first region PR. Thus, in describing FIGS. 3 and 4, details that are repetitive of FIGS. 1 and 2 will be briefly described or are not repeated.

The semiconductor chip 100-1 of FIGS. 3 and 4 may include a second passivation layer 155 including a connection hole 158-1 that exposes a portion of a redistribution wiring layer 135 in the first region PR. Therefore, the semiconductor chip 100-1 of FIGS. 3 and 4 may include a redistribution wiring connection pad 170-1 exposed by the connection hole 158-1 that exposes the redistribution wiring layer 135 in the first region PR.

A chip pad 120, a redistribution wiring test pad 160, and the redistribution wiring connection pad 170-1 may be disposed at a central portion CP of a chip body 110. The chip pad 120, the redistribution wiring test pad 160, and the redistribution wiring connection pad 170-1 may be disposed at the first region PR of the chip body 110.

A redistribution wiring structure 130 may extend in a first direction (for example, toward the left along the X-axis in FIG. 4) from the chip pad 120 on the chip body 110 and may be electrically connected to the redistribution wiring test pad 160 and the redistribution wiring connection pad 170-1. Furthermore, a highly integrated internal circuit element 145a including a memory cell array that includes a transistor, a capacitor, and a combination thereof that may be identical to the semiconductor chip 100 of FIGS. 1 and 2 may not be disposed at a lower portion 140 of the redistribution wiring test pad 160. The redistribution wiring structure 130 may extend in a second direction (for example, toward the right along the X-axis in FIG. 4), which is opposite or substantially opposite to the first direction, from the chip pad 120 on the chip body 110.

As described above, physical stress is not applied to the internal circuit element 145a including the memory cell array in a testing operation of the semiconductor chip 100-1, and thus, the reliability of the semiconductor chip 100-1 may be enhanced. Furthermore, in the semiconductor chip 100-1 according to an exemplary embodiment, arrangement of the chip pad 120, the redistribution wiring test pad 160 and the redistribution wiring connection pad 170-1, which are connected to the chip pad 120, may be freely changed, and thus, a degree of freedom of a chip design may be enhanced, thereby miniaturizing a chip. Depending on the case, the semiconductor chip 100-1 according to an exemplary embodiment may be electrically connected to an external device through the redistribution wiring test pad 160 without using the redistribution wiring connection pad 170.

Figure 5:
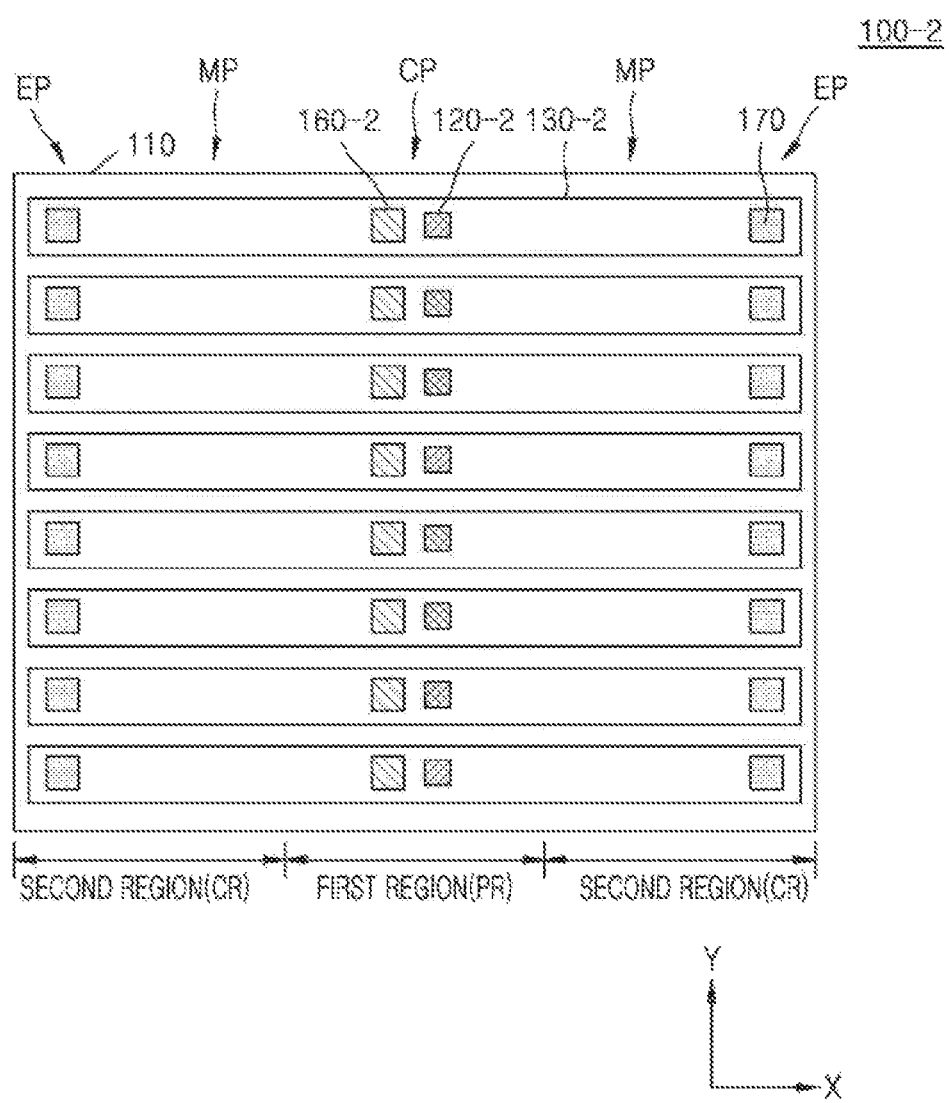
FIG. 5 is a plan view illustrating a main portion of a semiconductor chip according to an exemplary embodiment.

FIG. 5 is a plan view illustrating a main portion of a semiconductor chip 100-2 according to an exemplary embodiment.

In detail, the semiconductor chip 100-2 of FIG. 5 may be similar to the semiconductor chip 100 of FIGS. 1 and 2, except for an arrangement a chip pad 120-2, a redistribution wiring test pad 160-2, and a redistribution wiring structure 130-2. Thus, in describing FIG. 5, details that are repetitive of FIGS. 1 and 2 will be briefly described or are not repeated.

In the semiconductor chip 100-2 of FIG. 5, a plurality of chip pads 120-2 may be arranged in one row in a lateral direction (a Y-axis direction), and a plurality of redistribution wiring test pads 160-2 may be arranged in one row in the lateral direction (the Y-axis direction). In the semiconductor chip 100-2 of FIG. 5, a redistribution wiring structure 130-2 may electrically connect one chip pad 120-2 to one redistribution wiring test pad 160-2 and two redistribution wiring connection pads 170 in a column direction.

The chip pads 120-2 and a plurality of redistribution wiring test pads 160 may be disposed at a central portion CP of a chip body 110. The redistribution wiring connection pad 170 may be disposed in a near-edge portion EP of the chip body 110. The redistribution wiring structure 130-2 may be electrically connected to the redistribution wiring connection pad 170 via the chip pad 120-2 and a middle portion MP of the chip body 110.

As described above, physical stress is not applied to an internal circuit element 145a including a memory cell array in a testing operation of the semiconductor chip 100-2, and thus, the reliability of the semiconductor chip 100-2 may be enhanced. Furthermore, in the semiconductor chip 100-2 according to an exemplary embodiment, arrangement of the chip pad 120-2 and the redistribution wiring test pad 160-2 and the redistribution wiring connection pad 170, which are connected to the chip pad 120-2, may be freely changed, thereby miniaturizing a chip.

Figure 6:
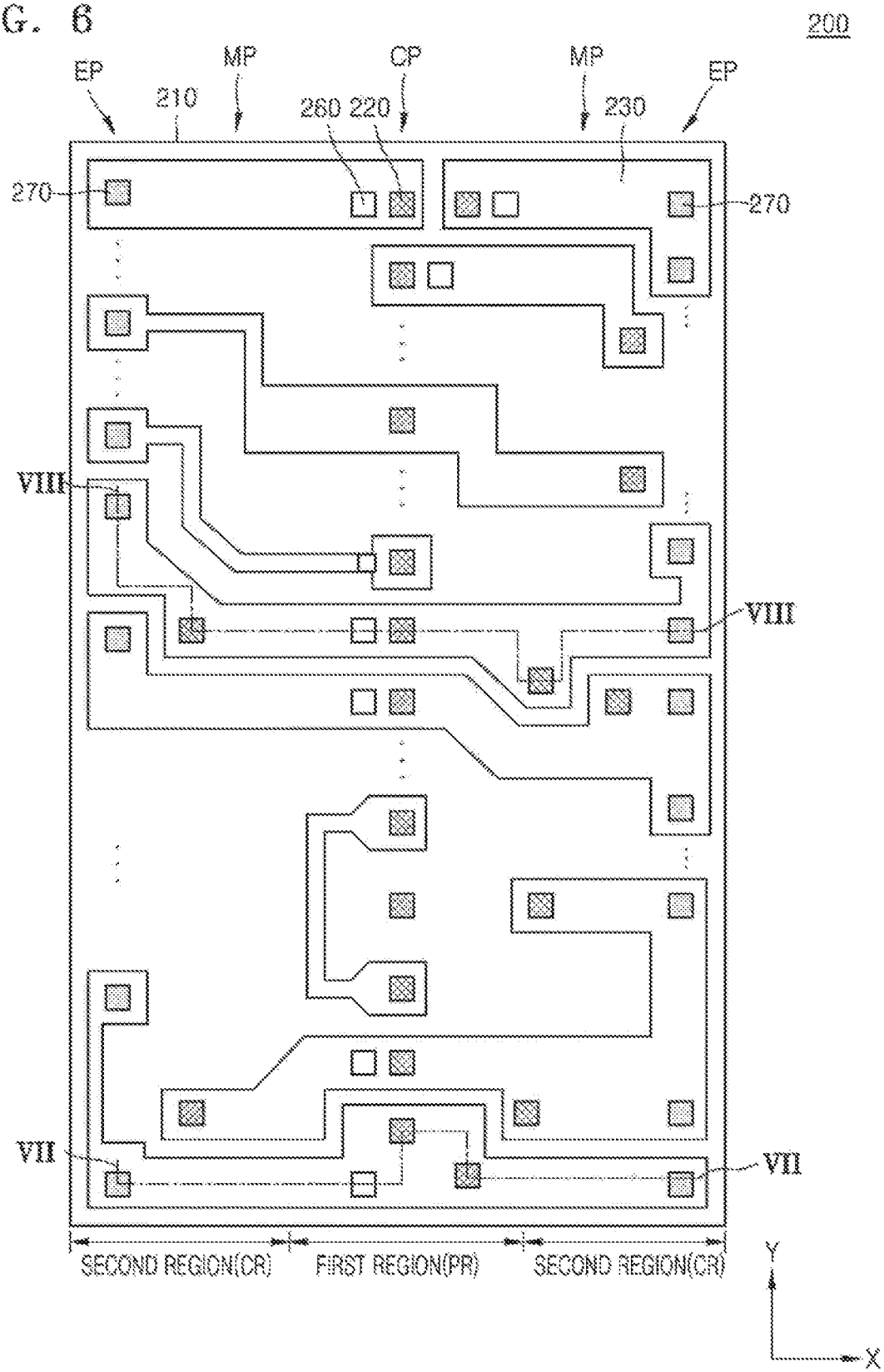
FIG. 6 is a plan view illustrating a main portion of a semiconductor chip according to an exemplary embodiment.
Figure 7:
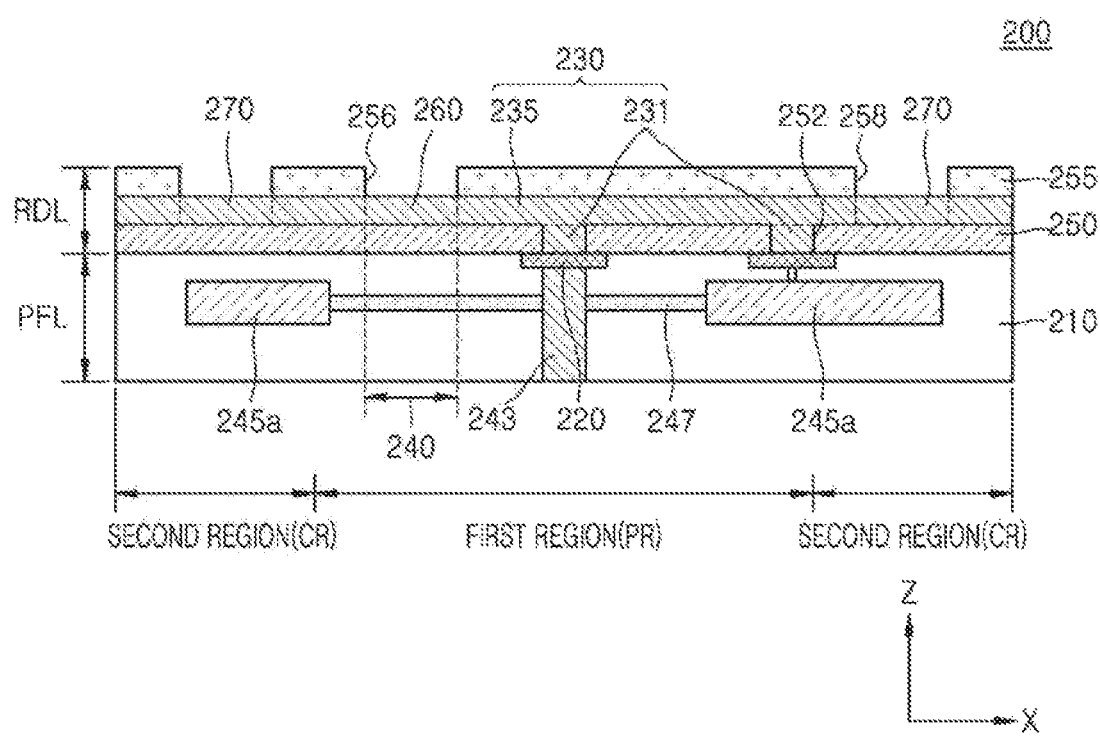
FIG. 7 is a cross-sectional view taken along line VII-VII of FIG. 6.

FIG. 6 is a plan view illustrating a main portion of a semiconductor chip 200 according to an exemplary embodiment. FIG. 7 is a cross-sectional view taken along line of FIG. 6, and FIG. 8 is a cross-sectional view taken along line VIII-VIII of FIG. 6.

Figure 8:
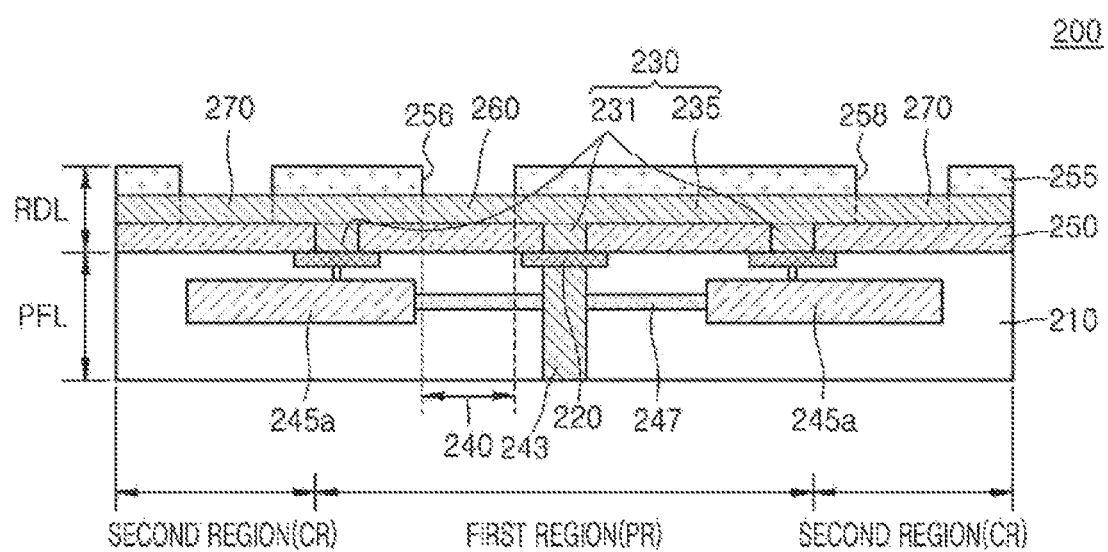
FIG. 8 is a cross-sectional view taken along line VIII-VIII of FIG. 6.

In detail, the semiconductor chip 200 of FIGS. 6 to 8 may be similar to the semiconductor chip 100 of FIGS. 1 and 2, except for an arrangement and connection relationship of a chip pad 220, a redistribution wiring test pad 260, and a redistribution wiring connection pad 270 on a chip body 210. Thus, in describing FIGS. 6 to 8, details that are repetitive of FIGS. 1 and 2 will be briefly described or are not repeated.

The semiconductor chip 200 may include the chip pad 220 that is disposed on the chip body 210, the redistribution wiring test pad 260 that is electrically connected to the chip pad 220 by a redistribution wiring structure 230, and the redistribution wiring connection pad 270 that is electrically connected to the chip pad 220 by the redistribution wiring structure 230.

The chip pad 220 may correspond to the chip pad 120 of FIGS. 1 and 2. The redistribution wiring structure 230 may correspond to the redistribution wiring structure 130 of FIGS. 1 and 2. The redistribution wiring test pad 260 and the redistribution wiring connection pad 270 may respectively correspond to the redistribution wiring test pad 160 and the redistribution wiring connection pad 170 of FIGS. 1 and 2.

The chip body 210 may include a first region PR and a second region CR. The first region PR may be a peripheral circuit region that controls the second region CR. The second region CR may be a core region that performs a main function of the semiconductor chip 100, for example, a data storing function. The second region CR may be a core region that includes a memory cell array storing data. The first region PR may be a peripheral circuit region that includes a control circuit controlling the memory cell array.

The chip body 210 may include a chip via 243, an internal circuit element 245a, and an internal wiring 247. The chip via 243 may be electrically connected to the chip pad 220 and the internal circuit element 245a. The internal circuit element 245a disposed in the second region CR may be a memory cell array. The memory cell array may be a highly integrated circuit element that includes a transistor (not shown), a capacitor (not shown), and a combination thereof.

The chip pad 220 may be disposed on the chip body 210. The chip pad 220 may be provided through a chip pad forming level PFL that includes the chip via 243, the internal circuit element 245a, and the internal wiring 247.

The chip pad 220 may be disposed at a central portion CP of the chip body 210. The chip pad 220 may be configured with a plurality of chip pads that are arranged spaced apart from each other in a lateral direction (a Y-axis direction) or a column direction (an X-axis direction. The chip pad 220 may be provided in plurality, and the plurality of chip pads 220 may be arranged in the column direction (the X-axis direction) or the lateral direction (the Y-axis direction) on the chip body 210.

The redistribution wiring connection pad 270, which is connected to an external device (or an external board, a wiring board, or the like) in connection with the chip pad 220, may be disposed in a desired region of the chip body 210 through a redistribution wiring process. A degree of freedom of a chip design may be increased by using the redistribution wiring process. The chip pad 220 may be electrically connected to the redistribution wiring structure 230 through the redistribution wiring process.

The redistribution wiring structure 230 may include a redistribution wiring via 231 disposed on the chip pad 220 and a redistribution wiring layer 235 connected to the redistribution wiring via 231. The redistribution wiring via 231 may be disposed in a via hole 252 that is formed in a first passivation layer 250 on the chip body 210. The redistribution wiring via 231 may be insulated from another redistribution wiring via (not shown) by the first passivation layer 250. The first passivation layer 250 may be formed of silicon oxide, silicon nitride, and/or the like.

The redistribution wiring layer 235 may be formed for rewiring of the chip pad 220. A second passivation layer 255, which includes a test hole 256 and a connection hole 258 that each expose a portion of the redistribution wiring layer 235, may be formed on the redistribution wiring layer 235. The second passivation layer 255 may be formed of silicon oxide, silicon nitride, and/or the like.

Therefore, the redistribution wiring layer 235 may include the redistribution wiring test pad 260 exposed by the test hole 256 and the redistribution wiring connection pad 270 exposed by the connection hole 258. The test pad 260 may be used in a testing operation of the semiconductor chip 200. The redistribution wiring connection pad 270 may be used in an operation that electrically connects the semiconductor chip 200 to an external device through a connection terminal (for example, a solder ball, a solder hump, or the like).

The redistribution wiring test pad 260 may be disposed in the first region PR. The internal circuit element 245a including the memory cell array may not be disposed under the redistribution wiring test pad 260 and overlap the redistribution wiring test pad 260. The highly integrated internal circuit element 245a including the memory cell array that includes a transistor, a capacitor, and a combination thereof may not be disposed at a lower portion 240 of the redistribution wiring test pad 260.

Therefore, physical stress is not applied to the internal circuit element 245a including the memory cell array in a testing operation or the semiconductor chip 200, and thus, the reliability of the semiconductor chip 200 may be enhanced. An internal circuit element including a control circuit or a control transistor may be disposed under the redistribution wiring test pad 260 depending on the case.

The redistribution wiring connection pad 270 may be disposed in the second region CR. The internal circuit element 245a including the memory cell array may be disposed under the redistribution wiring connection pad 270 to overlap the redistribution wiring connection pad 270. The redistribution wiring connection pad 270 may be disposed in the second region CR, but depending on the case, the redistribution wiring connection pad 270 may be disposed in the first region PR.

The redistribution wiring structure 230 may be one body that includes the redistribution wiring via 231 and the redistribution wiring layer 235. The redistribution wiring structure 230 may electrically connect the chip pad 220 to the redistribution wiring test pad 260. The redistribution wiring structure 230 may electrically connect the chip pad 220 to the redistribution wiring connection pad 270.

The first passivation layer 250, the second passivation layer 255, the redistribution wiring structure 230, the redistribution wiring test pad 260, and the redistribution wiring connection pad 270 may be formed on the chip pad 220 by a redistribution wiring forming level RDL. The redistribution wiring test pad 260 and the redistribution wiring connection pad 270 may be disposed at various positions on the chip body 210 through the redistribution wiring forming level RDL.

The redistribution wiring test pad 260 may be disposed at the central portion CP of the chip body 210. The redistribution wiring connection pad 270 may be disposed in a near-edge portion EP of the chip body 210. The redistribution wiring connection pad 270 may be provided in plurality, and the redistribution wiring connection pads 270 may be arranged spaced apart from each other in the lateral direction (the Y-axis direction). The redistribution wiring test pad 260 may be provided in plurality, and the redistribution wiring test pads 260 may be arranged in the lateral direction (the Y-axis direction) or the column direction (the X-axis direction).

The redistribution wiring structure 230 may electrically connect the chip pad 220 to the redistribution wiring test pad 260 and the redistribution wiring connection pad 270 in the lateral direction (the Y-axis direction) as well as the column direction (the X-axis direction). The redistribution wiring structure 230 may electrically connect at least one the chip pad 220 to at least one the redistribution wiring test pad 260. The redistribution wiring structure 230 may electrically connect at least one the chip pad 220 to at least one the redistribution wiring connection pad 270. FIG. 7 illustrates that the redistribution wiring structure 230 electrically connects two the chip pads 220 to one the redistribution wiring test pad 260 and two the redistribution wiring connection pads 270. FIG. 8 illustrates that the redistribution wiring structure 230 electrically connects three the chip pads 220 to one the redistribution wiring test pad 260 and two the redistribution wiring connection pads 270.

As described above, physical stress is not applied to the internal circuit element 245a including the memory cell array in a testing operation of the semiconductor chip 200, and thus, the reliability of the semiconductor chip 100 may be enhanced. Furthermore, in the semiconductor chip 200 according to an exemplary embodiment, arrangement of the chip pad 220 and the redistribution wiring test pad 260 and the redistribution wiring connection pad 270, which are connected to the chip pad 220, may be freely changed, and thus, a degree of freedom of a chip design may be enhanced, thereby miniaturizing a chip.

Figure 9:
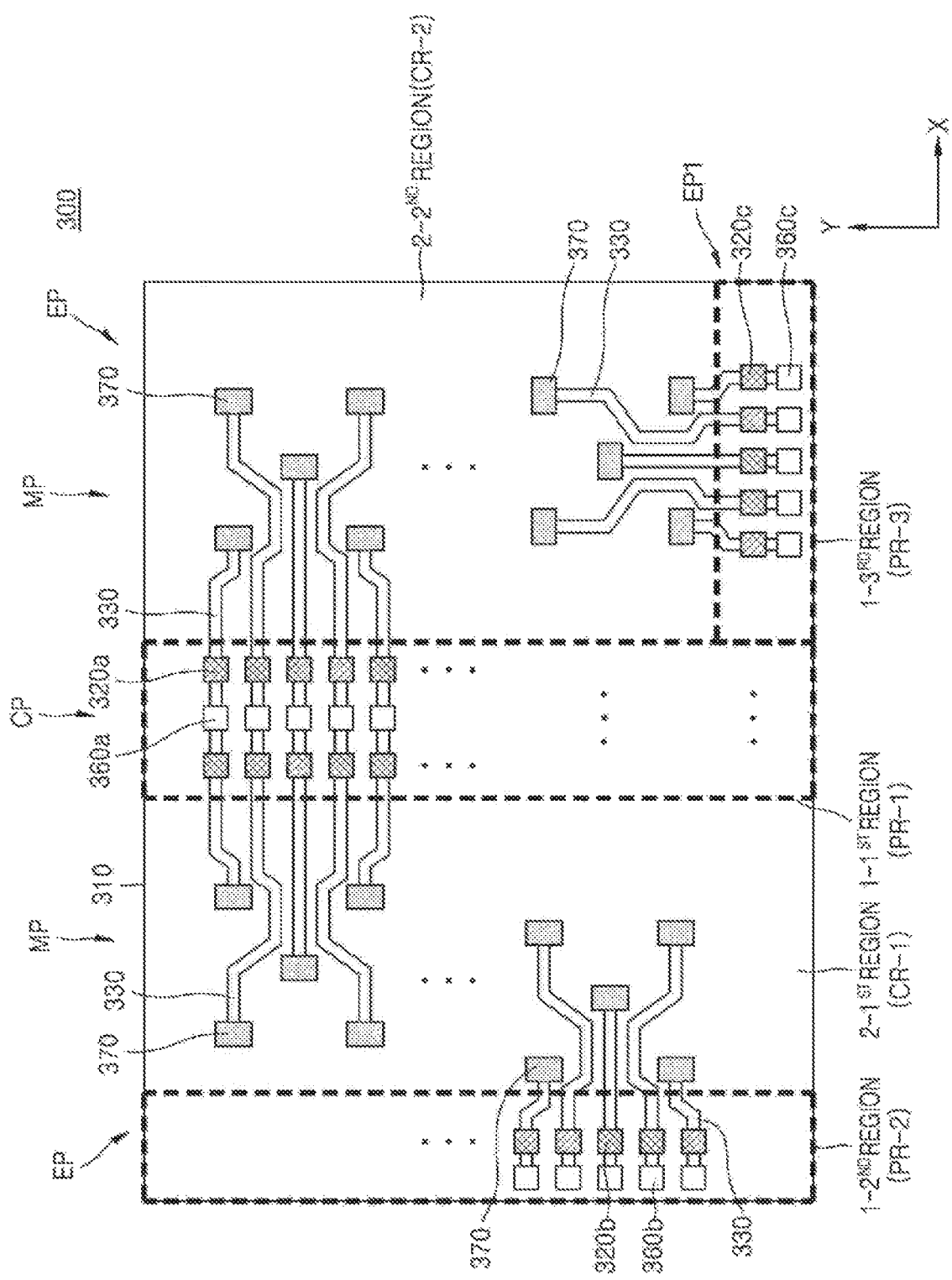
FIG. 9 is a plan view illustrating a main portion of a semiconductor chip according to an exemplary embodiment.

FIG. 9 is a plan view illustrating a main portion of a semiconductor chip 300 according to an exemplary embodiment.

In detail, the semiconductor chip 300 of FIG. 9 may be similar to the semiconductor chip 200 of FIGS. 6 to 8, except for an arrangement and connection relationship of a plurality of chip pads 320a to 320c, a plurality of redistribution wiring test pads 360a to 360c, and a redistribution wiring connection pad 370 on a chip body 310. Thus, in describing FIG. 9, details that are repetitive of FIGS. 6 to 8 will be briefly described or are not repeated.

The semiconductor chip 300 may include the chip pads 320a to 320c that are disposed on the chip body 310, the redistribution wiring test pads 360a to 360c that are electrically connected to the chip pads 320a to 320c by a redistribution wiring structure 330, respectively, and the redistribution wiring connection pad 370 that is electrically connected to the chip pads 320a to 320c by the redistribution wiring structure 330.

The chip pads 320a to 320c may correspond to the chip pad 220 of FIGS. 6 to 8. The redistribution wiring structure 330 may correspond to the redistribution wiring structure 230 of FIGS. 6 to 8. The redistribution wiring test pads 360a to 360c and the redistribution wiring connection pad 370 may respectively correspond to the redistribution wiring test pad 260 and the redistribution wiring connection pad 270 of FIGS. 6 to 8.

The chip body 310 may include a first region PR including a plurality of first sub-regions PR-1 to PR-3 and a second region CR including a plurality of second sub-regions CR-1 and CR-2. The plurality of first sub-regions PR-1 to PR-3 may include a 1-1st region PR-1, a 1-2nd region PR-2, and a 1-3rd region PR-3. The 1-1st region PR-1 may be disposed at a central portion CP of the chip body 310. The 1-2nd region PR-2 may be disposed in one near-edge portion EP of the chip body 310. The 1-3rd region PR-3 may be disposed at another near-edge portion EP1 of the chip body 310 in a column direction (an X-axis direction).

The plurality of second sub-regions CR-1 and CR-2 may include a 2-1st region CR-1 and a 2-2nd region CR-2. The 2-1st region CR-1 may be disposed at a middle portion MP of the chip body 310. The 2-2nd region CR-2 may be disposed at the middle portion MP and the near-edge portion EP of the chip body 310. The second region CR may be a core region that performs a main function of the semiconductor chip 300, for example, a data storing function. The first region PR may be a peripheral circuit region that includes a control circuit controlling the second region CR.

The chip pads 320a to 320c may be disposed on the chip body 310. The chip pads 320a to 320c may be disposed in the first region PR or the second region CR. The chip pads 320a to 320c may be respectively disposed at the central portion CP and the near-edge portion EP of the chip body 310 and the other near-edge portion EPI of the chip body 310 in the column direction. Each of the chip pads 320a to 320c may be provided in plurality. The plurality of chip pads 320a may be arranged spaced apart from each other in a lateral direction (a Y-axis direction) or the column direction (the X-axis direction) on the chip body 310, the plurality of chip pads 320b may be arranged to be spaced apart from each other in the lateral direction (the Y-axis direction) or the column direction (the X-axis direction) on the chip body 310, and the plurality of chip pads 320c may be arranged spaced apart from each other in the lateral direction (the Y-axis direction) or the column direction (the X-axis direction) on the chip body 310.

The chip pads 320a to 320c may be rewired in an arbitrary region of the chip body 310 by the redistribution wiring structure 330 and may be electrically connected to the redistribution wiring test pads 360a to 360c, respectively. The chip pads 320a to 320c may be electrically connected to the redistribution wiring connection pad 370.

The redistribution wiring test pads 360a to 360c may be disposed in the first region PR including the plurality of first sub-regions PR-1 to PR-3. An internal circuit element that performs a main function (for example, a data storing function) of the semiconductor chip 300 may not be disposed in the first region PR where the redistribution wiring test pads 360a to 360c are disposed. The redistribution wiring test pads 360a to 360c may be respectively disposed at the central portion CP and the near-edge portion EP of the chip body 310 and the other near-edge portion EP1 of the chip body 310 in the column direction. Each of the redistribution wiring test pads 360a to 360c may be provided in plurality. The plurality of redistribution wiring test pads 360a may be arranged spaced apart from each other in the lateral direction (the Y-axis direction) or the column direction (the X-axis direction), the plurality of redistribution wiring test pads 360b may be arranged to be spaced apart from each other in the lateral direction (the Y-axis direction) or the column direction (the X-axis direction), and the plurality of redistribution wiring test pads 360c may be arranged spaced apart from each other in the lateral direction (the Y-axis direction) or the column direction (the X-axis direction).

The redistribution wiring connection pad 370 may be disposed in the second region CR including the plurality of second sub-regions CR-1 and CR-2. The redistribution wiring connection pad 370 may be disposed at the middle portion MP and the near-edge portion EP of the chip body 310. The redistribution wiring connection pad 370 may be provided in plurality, and the plurality of redistribution wiring connection pads 370 may be arranged spaced apart from each other in the lateral direction (the Y-axis direction) or the column direction (the X-axis direction).

The redistribution wiring structure 330 may electrically connect the chip pads 320a to 320c to the redistribution wiring test pads 360a to 360c and the redistribution wiring connection pad 370 in the lateral direction (the Y-axis direction) as well as the column direction (the X-axis direction). The redistribution wiring structure 330 may electrically connect at least one the chip pads 320a to 320c to at least one the redistribution wiring test pads 360a to 360c. The redistribution wiring structure 330 may electrically connect at least one the chip pads 320a to 320c to at least one the redistribution wiring connection pad 370.

As described above, in the semiconductor chip 300 according to an exemplary embodiment, physical stress is not applied to an internal circuit element, and arrangement of the chip pads 320a to 320c and the redistribution wiring test pads 360a to 360c and the redistribution wiring connection pad 370, which are connected to the chip pads 320a to 320c, may be freely changed, and thus, a degree of freedom of a chip design may be enhanced, thereby miniaturizing a chip.

Figure 10:
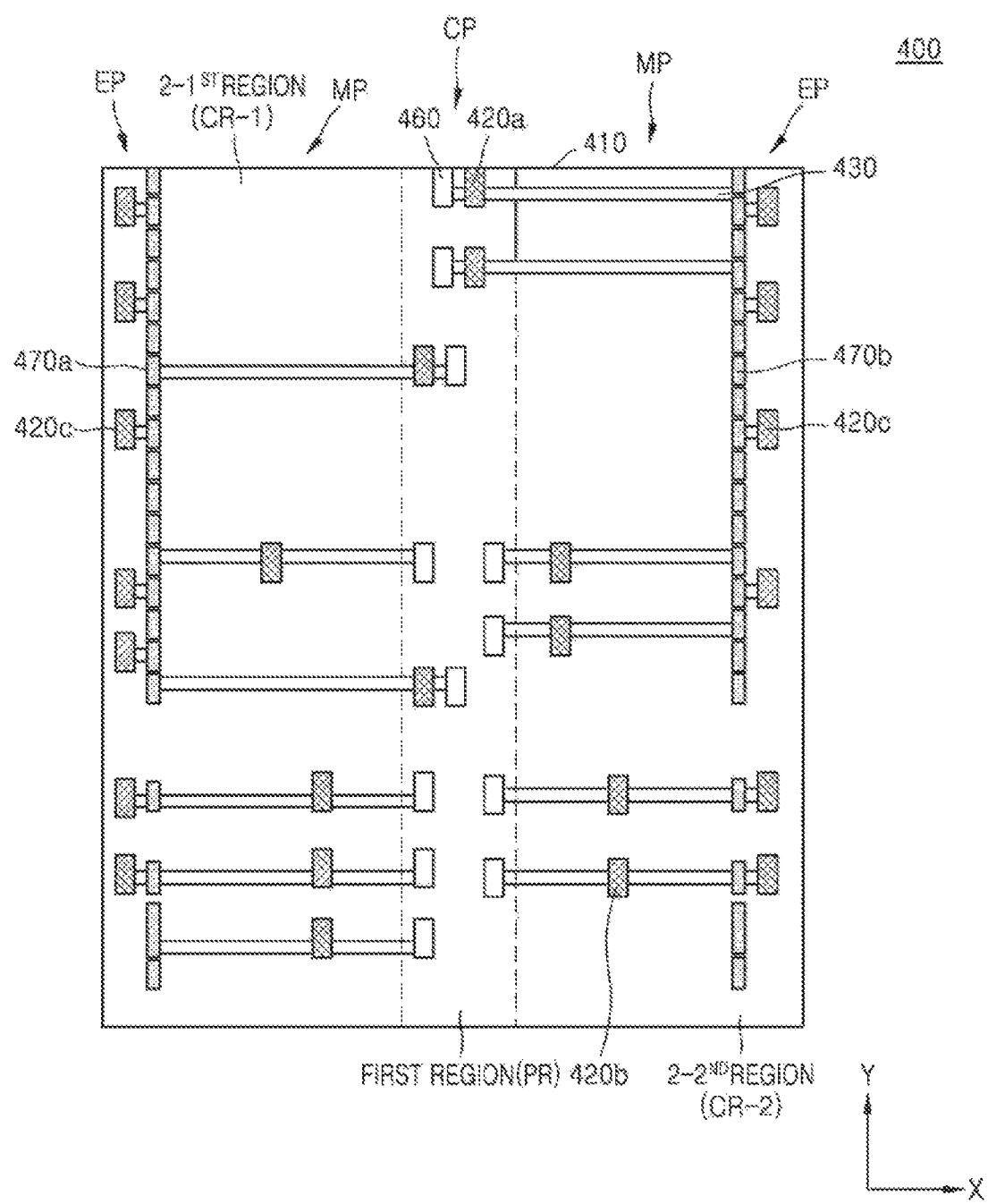
FIG. 10 is a plan view illustrating a main portion of a semiconductor chip according to an exemplary embodiment.

FIG. 10 is a plan view illustrating a main portion of a semiconductor chip 400 according to an exemplary embodiment.

In detail, the semiconductor chip 400 of FIG. 10 may be similar to the semiconductor chip 200 of FIGS. 6 to 8, except for an arrangement and connection relationship of a plurality of chip pads 420a to 420c, a redistribution wiring test pad 460, and a plurality of redistribution wiring connection pads 470a and 470b on a chip body 410. Thus, in describing FIG. 10, details that are repetitive of FIGS. 6 to 8 will be briefly described or are not repeated.

The semiconductor chip 400 may include the chip pads 420a to 420c that are disposed on the chip body 410, the redistribution wiring test pad 460 that is electrically connected to the chip pads 420a to 420c by a redistribution wiring structure 430, and the redistribution wiring connection pads 470a and 470b that are electrically connected to the chip pads 420a to 420c by the redistribution wiring structure 430.

The chip pads 420a to 420c may correspond to the chip pad 220 of FIGS. 6 to 8. The redistribution wiring structure 430 may correspond to the redistribution wiring structure 230 of FIGS. 6 to 8. The redistribution wiring test pad 460 may correspond to the redistribution wiring test pad 260 of FIGS. 6 to 8. The redistribution wiring connection pads 470a and 470b may correspond to the redistribution wiring connection pad 270 of FIGS. 6 to 8.

The chip body 410 may include a plurality of first regions PR and a second region CR including a plurality of second sub-regions CR-1 and CR-2. The plurality of second sub-regions CR-1 and CR-2 may include a 2-1st region CR-1 and a 2-2nd region CR-2. The 2-1st region CR-1 may be disposed at a left middle portion MP of the chip body 410. The 2-2nd region CR-2 may be disposed at a right middle portion MP of the chip body 410. The second region CR may be a core region that performs a main function of the semiconductor chip 400, for example, a data storing function. The first region PR may be a peripheral circuit region that controls the second region CR.

The chip pads 420a to 420c may be disposed on the chip body 410. The chip pads 420a to 420c may be disposed in the first region PR or the second region CR. The chip pads 420a to 420c may be respectively disposed at a central portion CP, a middle portion MP, and a near-edge portion EP of the chip body 410. Each of the chip pads 420a to 420c may be provided in plurality. The plurality of chip pads 420a may be arranged spaced apart from each other in a lateral direction (a Y-axis direction) or a column direction (an X-axis direction) on the chip body 410, the plurality of chip pads 420b may be arranged to be spaced apart From each other in the lateral direction (the Y-axis direction) or the column direction (the X-axis direction) on the chip body 410, and the plurality of chip pads 420c may be arranged spaced apart from each other in the lateral direction (the Y-axis direction) or the column direction (the X-axis direction) on the chip body 410.

The chip pads 420a to 420c may be rewired in an arbitrary region of the chip body 410 by the redistribution wiring structure 430 and may be electrically connected to the redistribution wiring test pad 460 and the redistribution wiring connection pads 470a and 470b. The redistribution wiring test pad 460 may be disposed in the first region PR. An internal circuit element that performs a main function (for example, a data storing function) of the semiconductor chip 400 may not be disposed in the first region PR where the redistribution wiring test pad 460 is disposed. The redistribution wiring test pad 460 may be respectively disposed at the central portion CP of the chip body 410. The redistribution wiring test pad 460 may be provided in plurality, and the plurality of redistribution wiring test pads 460 may be arranged spaced apart from each other in the lateral direction (the Y-axis direction) or the column direction (the X-axis direction).

The redistribution wiring connection pads 470a and 470b may be disposed in the second region CR including the plurality of second sub-regions CR-1 and CR-2. The redistribution wiring connection pads 470a and 470b may be disposed at the near-edge portion EP of the chip body 410, Each of the redistribution wiring connection pads 470a and 470b may be provided in plurality. The plurality of redistribution wiring connection pads 470a may be arranged spaced apart from each other in the lateral direction (the Y-axis direction), and the plurality of redistribution wiring connection pads 470b may be arranged spaced apart from each other in the lateral direction (the Y-axis direction).

The redistribution wiring structure 430 may electrically connect the chip pads 420a to 420c to the redistribution wiring test pad 460 and the redistribution wiring connection pads 470a and 470b in the column direction (the X-axis direction). The redistribution wiring structure 430 may electrically connect at least one the chip pads 420a to 420c to at least one the redistribution wiring test pad 460. The redistribution wiring structure 430 may electrically connect at least one the chip pads 420a to 420c to at least one the redistribution wiring connection pads 470a and 470b.

As described above, in the semiconductor chip 400 according to an exemplary embodiment, physical stress is not applied to an internal circuit element, and arrangement of the chip pads 420a to 420c and the redistribution wiring test pad 460 and the redistribution wiring connection pads 470a and 470b which are connected to the chip pads 420a to 420c may be freely changed, and thus, a degree of freedom of a chip design is enhanced, thereby miniaturizing a chip.

Figure 11:
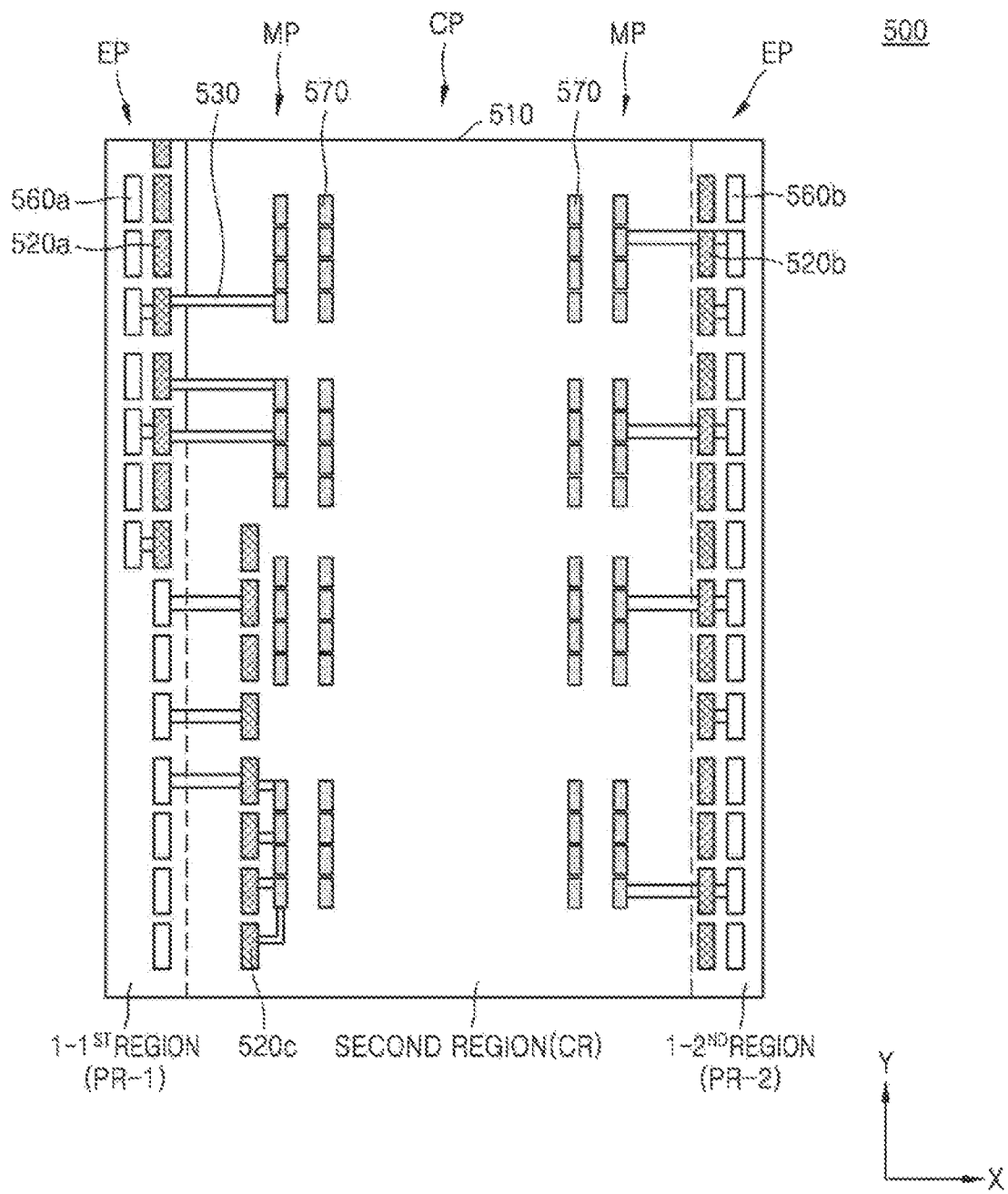
FIG. 11 is a plan view illustrating a main portion of a semiconductor chip according to an exemplary embodiment.

FIG. 11 is a plan view illustrating a main portion of a semiconductor chip 500 according to an exemplary embodiment.

In detail, the semiconductor chip 500 of FIG. 11 may be similar to the semiconductor chip 200 of FIGS. 6 to 8, except for an arrangement and connection relationship of a plurality of chip pads 520a to 520c, a plurality of redistribution wiring test pads 560a and 560b, and a redistribution wiring connection pad 570 on a chip body 510. Thus, in describing FIG. 11, details that are repetitive of FIGS. 6 to 8 will be briefly described or are not repeated.

The semiconductor chip 500 may include the chip pads 520a to 520c that are disposed on the chip body 510, the redistribution wiring test pads 560a and 560b that are electrically connected to the chip pads 520a to 520c by a redistribution wiring structure 530, and the redistribution wiring connection pad 570 that is electrically connected to the chip pads 520a to 520c by the redistribution wiring structure 530.

The chip pads 520a to 520c may correspond to the chip pad 220 of FIGS. 6 to 8. The redistribution wiring structure 530 may correspond to the redistribution wiring structure 230 of FIGS. 6 to 8. The redistribution wiring test pads 560a and 560b may correspond to the redistribution wiring test pad 260 of FIGS. 6 to 8. The redistribution wiring connection pad 570 may correspond to the redistribution wiring connection pad 270 of FIGS. 6 to 8.

The chip body 510 may include a first region PR including a plurality of first sub-regions PR-1 and PR-2 and a second region CR. The plurality of first sub-regions PR-1 and PR-2 may include a 1-1st region PR-1 and a 1-2nd region PR-2. The 1-1st region PR-1 may be disposed at a left near-edge portion EP of the chip body 510. The 1-2nd region PR-2 may be disposed at a right near-edge portion EP of the chip body 510. The second region CR may be a core region that performs a main function of the semiconductor chip 500, for example, a data storing function. The first region PR may be a peripheral circuit region that controls the second region CR.

The chip pads 520a to 520c may be disposed on the chip body 510. The chip pads 520a to 520c may be disposed in the first region PR or the second region CR. The chip pads 520a to 520c may be respectively disposed at a left middle portion MP, the near-edge portion EP, and the right near-edge portion EP of the chip body 510. Each of the chip pads 520*a* to 520*c* may be provided in plurality. The plurality of chip pads 520*a* may be arranged spaced apart from each other in a lateral direction (a Y-axis direction) or a column direction (an X-axis direction), the plurality of chip pads 520*b* may be arranged spaced apart from each other in the lateral direction (the Y-axis direction) or the column direction (the X-axis direction), and the plurality of chip pads 520*c* may be arranged to be spaced apart from each other in the lateral direction (the Y-axis direction) or the column direction (the X-axis direction).

The chip pads 520*a* to 520*c* may be rewired in an arbitrary region of the chip body 510 by the redistribution wiring structure 530 and may be electrically connected to the redistribution wiring test pads 560*a* and 560*b* and the redistribution wiring connection pad 570. The redistribution wiring test pads 560*a* and 560*b* may be disposed in the first region PR. An internal circuit element that performs a main function (for example, a data storing function) of the semiconductor chip 500 may not be disposed in the first region PR where the redistribution wiring test pads 560*a* and 560*b* are disposed. The redistribution wiring test pads 560*a* and 560*b* may be respectively disposed at the near-edge portion EP and the right near-edge portion EP of the chip body 510. Each of the redistribution wiring test pads 560*a* and 560*b* may be provided in plurality. The plurality of redistribution wiring test pads 560*a* may be arranged to be spaced apart from each other in the lateral direction (the Y-axis direction) or the column direction (the X-axis direction), and the plurality of redistribution wiring test pads 560*b* may be arranged spaced apart from each other in the lateral direction (the Y-axis direction) or the column direction (the X-axis direction).

The redistribution wiring connection pad 570 may be disposed in the second region CR. The redistribution wiring connection pad 570 may be disposed at each of the left middle portion MP and a right middle portion MP of the chip body 510. The redistribution wiring connection pad 570 may be provided in plurality, and the plurality of redistribution wiring connection pads 570 may be arranged spaced apart from each other in the lateral direction (the Y-axis direction).

The redistribution wiring structure 530 may electrically connect the chip pads 520*a* to 520*c* to the redistribution wiring test pads 560*a* and 560*b* and the redistribution wiring connection pad 570 in the column direction (the X-axis direction). The redistribution wiring structure 530 may electrically connect at least one the chip pads 520*a* to 520*c* to at least one the redistribution wiring test pads 560*a* and 560*b*. The redistribution wiring structure 530 may electrically connect at least one the chip pads 520*a* to 520*c* to at least one the redistribution wiring connection pad 570.

As described above, in the semiconductor chip 500 according to an exemplary embodiment, physical stress is not applied to an internal circuit element, and arrangement of the chip pads 520*a* to 520*c* and the redistribution wiring test pads 560*a* and 560*b* and the redistribution wiring connection pad 570, which are connected to the chip pads 520*a* to 520*c*, may be freely changed, and thus, a degree of freedom of a chip design may be enhanced, thereby miniaturizing a chip.

Figure 12:
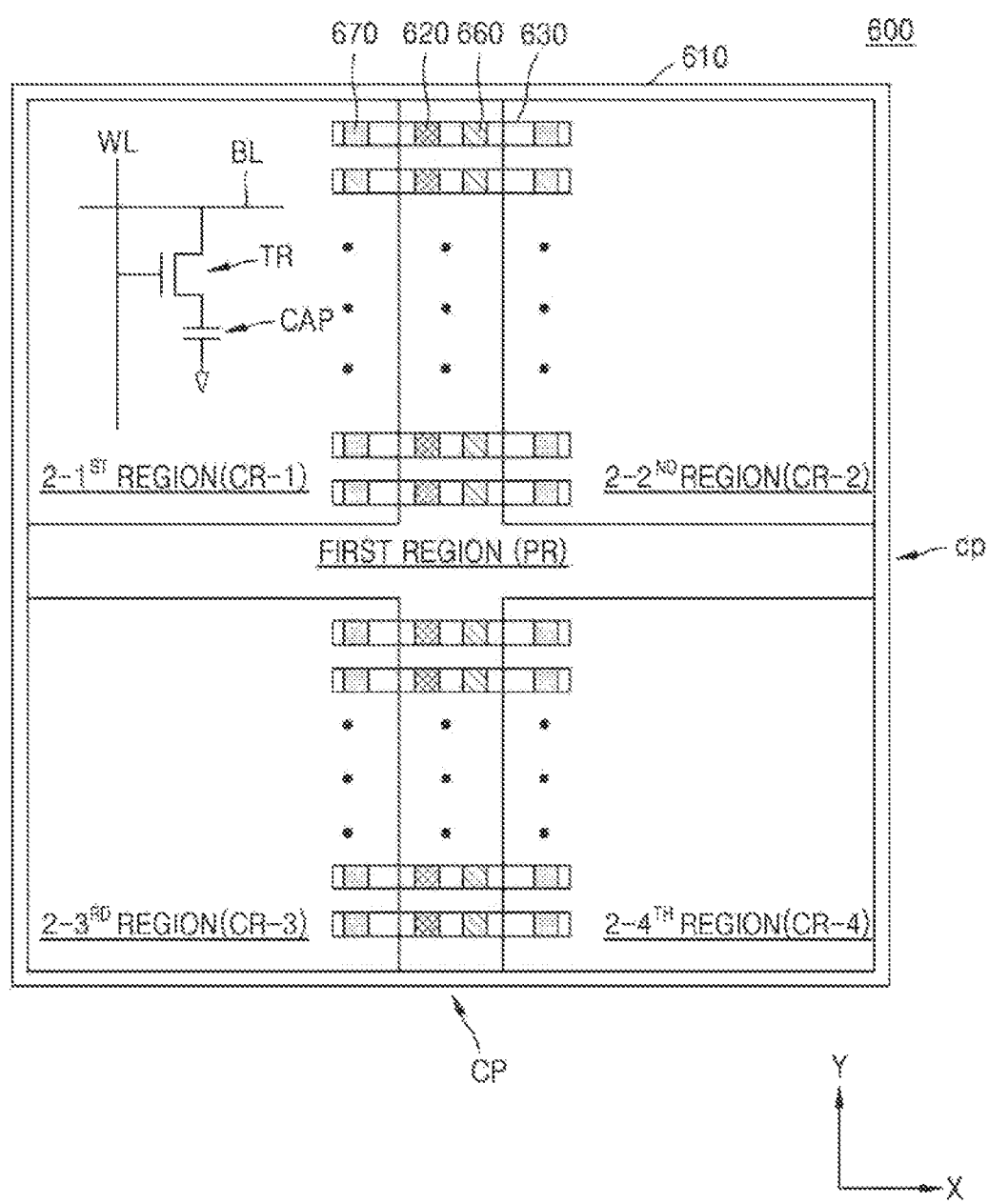
FIG. 12 is a plan view illustrating a main portion of a semiconductor chip according to an exemplary embodiment.

FIG. 12 is a plan view illustrating a main portion of a semiconductor chip 600 according to an exemplary embodiment.

In detail, the semiconductor chip 600 of FIG. 12 may be similar to the semiconductor chip 200 of FIGS. 6 to 8, except for an arrangement and connection relationship of a chip pad 620, a redistribution wiring test pad 660, and a redistribution wiring connection pad 670 on a chip body 610. Thus, in describing FIG. 12, details that are repetitive of FIGS. 6 to 8 will be briefly described or are not repeated.

The semiconductor chip 600 may include the chip pad 620 that is disposed on the chip body 610, the redistribution wiring test pad 660 that is electrically connected to the chip pad 620 by a redistribution wiring structure 630, and the redistribution wiring connection pad 670 that is electrically connected to the chip pad 620 by the redistribution wiring structure 630.

The chip pad 620 may correspond to the chip pad 220 of FIGS. 6 to 8. The redistribution wiring structure 630 may correspond to the redistribution wiring structure 230 of FIGS. 6 to 8. The redistribution wiring test pad 660 may correspond to the redistribution wiring test pad 260 of FIGS. 6 to 8. The redistribution wiring connection pad 670 may correspond to the redistribution wiring connection pad 270 of FIGS. 6 to 8.

The chip body 610 may include a first region PR and a second region CR including a plurality of second sub-regions CR-1 to CR-4. The second region CR may be a core region that performs a main function of the semiconductor chip 600, for example, a data storing function. An internal circuit element including a memory cell array that includes a word line WL, a hit line BL, a transistor TR, and a capacitor CAP may be disposed in the second region CR. The second region CR may be a dynamic random access memory (DRAM) cell array. The plurality of second sub-regions CR-1 to CR-4 may include a 2-1st region CR-1, a 2-2nd region CR-2, a 2-3rd region CR-3, and a 2-4th region CR-4. Each of the second sub-regions CR-1 to CR-4 may be a sub-core region.

In FIG. 12, the second region CR2 may be divided into four the second sub-regions CR-1 to CR-4, which may be disposed on the chip body 610. However, depending on the case, the 2-1st region CR-1 and the 2-3rd region CR-3 may be provided as one sub-region, and the 2-2nd region CR-2 and the 2-4th region CR-4 may be provided as one sub-region. The first region PR may be a peripheral circuit region that controls the second region CR. The first region PR may be disposed at a central portion CP of the chip body 610 in a lateral direction (a Y-axis direction) or a column direction (an X-axis direction).

The chip pad 620 may be disposed on the chip body 610. The chip pad 620 may be disposed in the first region PR. The chip pad 620 may be disposed at the central portion CP of the chip body 610 in the lateral direction (the Y-axis direction). Depending on the case, the chip pad 620 may be disposed at the central portion CP of the chip body 610 in the column direction (the X-axis direction). The chip pad 620 may be provided in plurality, and the plurality of chip pads 620 may be arranged spaced apart from each other.

The chip pad 620 may be rewired in an arbitrary region of the chip body 610 by the redistribution wiring structure 630 and may be electrically connected to the redistribution wiring test pad 660 and the redistribution wiring connection pad 670. The redistribution wiring test pad 660 may be disposed in the first region PR. An internal circuit element that performs a main function (for example, a data storing function) of the semiconductor chip 600 may not be disposed in the first region PR where the redistribution wiring test pad 660 is disposed.

The redistribution wiring test pad 660 may be disposed at the central portion CP of the chip body 610 in the lateral direction (the Y-axis direction). The redistribution wiring test pad 660 may be provided in plurality, and the plurality of redistribution wiring test pads 660 may be arranged spaced apart from each other in the lateral direction (the Y-axis direction). The redistribution wiring connection pad 670 may be disposed in the second region CR. The redistribution wiring connection pad 670 may be provided in plurality, and the plurality of redistribution wiring connection pads 670 may be arranged spaced apart from each other in the lateral direction (the Y-axis direction).

The redistribution wiring structure 630 may electrically connect the chip pad 620 to the redistribution wiring test pad 660 and the redistribution wiring connection pad 670 in the column direction (the X-axis direction). The redistribution wiring structure 630 may electrically connect the chip pad 620 to the redistribution wiring test pad 660. The redistribution wiring structure 630 may electrically connect the chip pad 620 to the redistribution wiring connection pad 670.

As described above, in the semiconductor chip 600 according to an exemplary embodiment, physical stress is not applied to an internal circuit element, and arrangement of the chip pad 620 and the redistribution wiring test pad 660 and the redistribution wiring connection pad 670, which are connected to the chip pad 620, may be freely changed, and thus, a degree of freedom of a chip design may be enhanced, thereby miniaturizing a chip.

Figure 13:
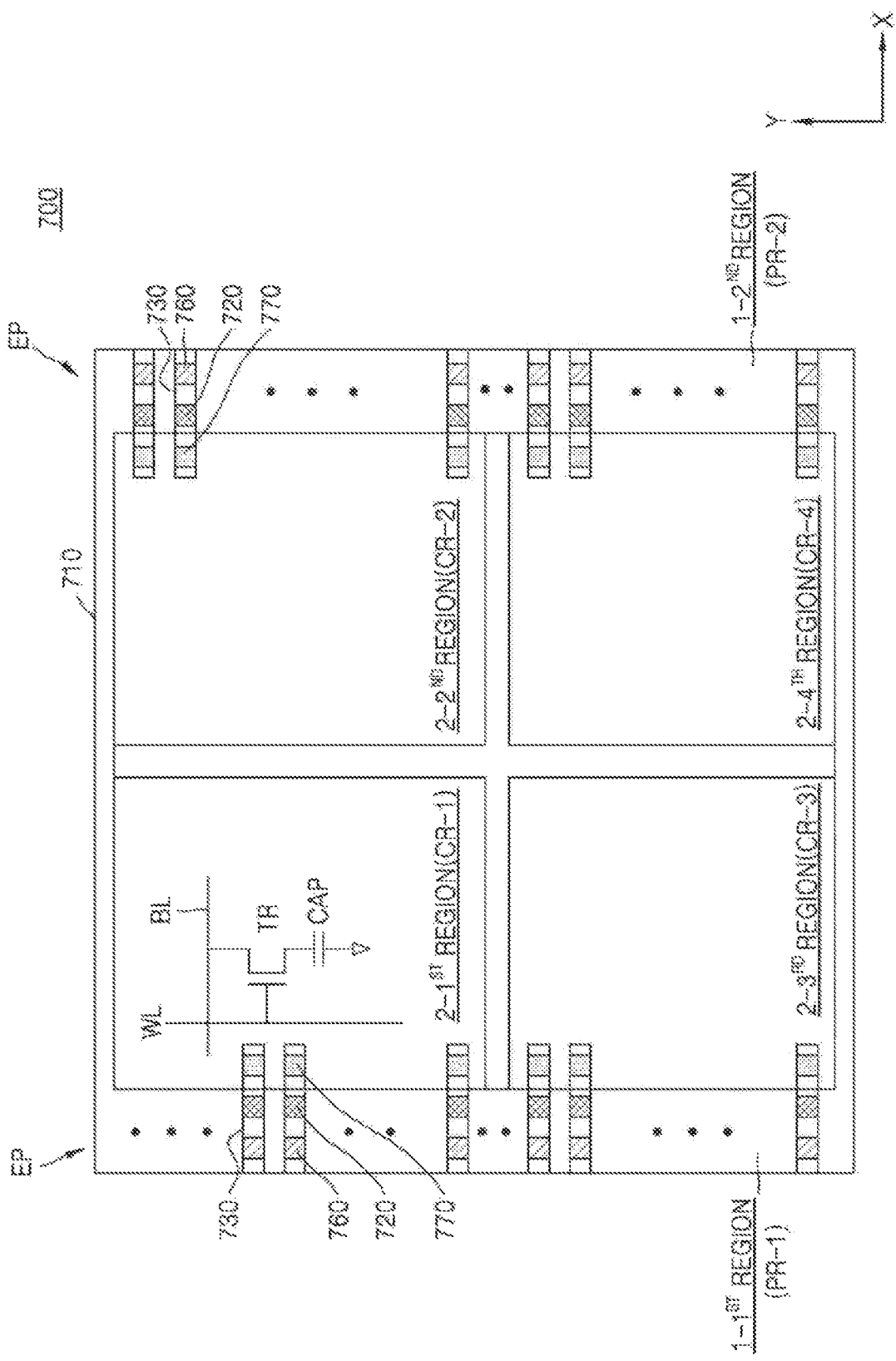
FIG. 13 is a plan view illustrating a main portion of a semiconductor chip according to an exemplary embodiment.

FIG. 13 is a plan view illustrating a main portion of a semiconductor chip 700 according to an exemplary embodiment.

In detail, the semiconductor chip 700 of FIG. 13 may be similar to the semiconductor chip 200 of FIGS. 6 to 8 and the semiconductor chip 600 of FIG. 12, except for an arrangement and connection relationship of a chip pad 720, a redistribution wiring test pad 760, and a redistribution wiring connection pad 770 on a chip body 710. Thus, in describing FIG. 13, details that are repetitive of FIGS. 6 to 8 and 12 will be briefly described or are not repeated.

The semiconductor chip 700 may include the chip pad 720 that is disposed on the chip body 710, the redistribution wiring test pad 760 that is electrically connected to the chip pad 720 by a redistribution wiring structure 730, and the redistribution wiring connection pad 770 that is electrically connected to the chip pad 720 by the redistribution wiring structure 730.

The chip pad 720 may correspond to the chip pad 220 of FIGS. 6 to 8 and chip pad 620 of FIG. 12. The redistribution wiring structure 730 may correspond to the redistribution wiring structure 230 of FIGS. 6 to 8 and the redistribution wiring structure 630 of FIG. 12. The redistribution wiring test pad 760 may correspond to the redistribution wiring test pad 260 of FIGS. 6 to 8 and the redistribution wiring test pad 660 of FIG. 12. The redistribution wiring connection pad 770 may correspond to the redistribution wiring connection pad 270 of FIGS. 6 to 8 and the redistribution wiring connection pad 670 of FIG. 12.

The chip body 710 may include a first region PR including a plurality of first sub-regions PR-1 and PR-2 and a second region CR including a plurality of second sub-regions CR-1 to CR-4. The second region CR may be a core region that performs a main function of the semiconductor chip 600, for example, a data storing function. An internal circuit element including a memory cell array that includes a word line WL, a bit line BL, a transistor TR, and a capacitor CAP may be disposed in the second region CR. The second region CR may be a DRAM cell array. The plurality of second sub-regions CR-1 to CR-4 may include a 2-1st region CR-1, a 2-2nd region CR-2, a 2-3rd region CR-3, and a 2-4th region CR-4. Each of the second sub-regions CR-1 to CR-4 may be a sub-core region.

In FIG. 13, the second region CR-2 may be divided into four second sub-regions CR-1 to CR-4, which may be disposed on the chip body 710. However, depending on the case, the 2-1st region CR-1 and the 2-3rd region CR-3 may be provided as one sub-region, and the 2-2nd region CR-2 and the 2-4th region CR-4 may be provided as one sub-region. The first region PR may be a peripheral circuit region that controls the second region CR. The first region PR may be disposed in a near-edge portion EP of the chip body 710 in a lateral direction (a Y-axis direction).

The chip pad 720 may be disposed on the chip body 710. The chip pad 720 may be disposed in the first region PR including the plurality of first sub-regions PR-1 and PR-2. The chip pad 720 may be disposed at the near-edge portion EP of the chip body 710 in the lateral direction (the Y-axis direction). The chip pad 720 may be provided in plurality, and the plurality of chip pads 720 may be arranged spaced apart from each other.

The chip pad 720 may be rewired in an arbitrary region of the chip body 710 by the redistribution wiring structure 730 and may be electrically connected to the redistribution wiring test pad 760 and the redistribution wiring connection pad 770. The redistribution wiring test pad 760 may be disposed in the first region PR including the plurality of first sub-regions PR-1 and PR-2. An internal circuit element that performs a main function (for example, a data storing function) of the semiconductor chip 700 may not be disposed in the first region PR where the redistribution wiring test pad 760 is disposed.

The redistribution wiring test pad 760 may be disposed at the near-edge portion EP of the chip body 710 in the lateral direction (i.e., the Y-axis direction). The redistribution wiring test pad 760 may be provided in plurality, and the plurality of redistribution wiring test pads 760 may be arranged spaced apart from each other in the lateral direction (the Y-axis direction). The redistribution wiring connection pad 770 may be provided in plurality, and the plurality of redistribution wiring connection pads 770 may be arranged spaced apart from each other in the lateral direction (the Y-axis direction).

The redistribution wiring structure 730 may electrically connect the chip pad 720 to the redistribution wiring test pad 760 and the redistribution wiring connection pad 770 in the column direction (the X-axis direction). The redistribution wiring structure 730 may electrically connect the chip pad 720 to the redistribution wiring test pad 760. The redistribution wiring structure 730 may electrically connect the chip pad 720 to the redistribution wiring connection pad 770.

As described above, in the semiconductor chip 700 according to an exemplary embodiment, physical stress is not applied to an internal circuit element, and arrangement of the chip pad 720 and the redistribution wiring test pad 760 and the redistribution wiring connection pad 770, which are connected to the chip pad 720, may be freely changed, and thus, a degree of freedom of a chip design is enhanced, thereby miniaturizing a chip.

Figure 14A:
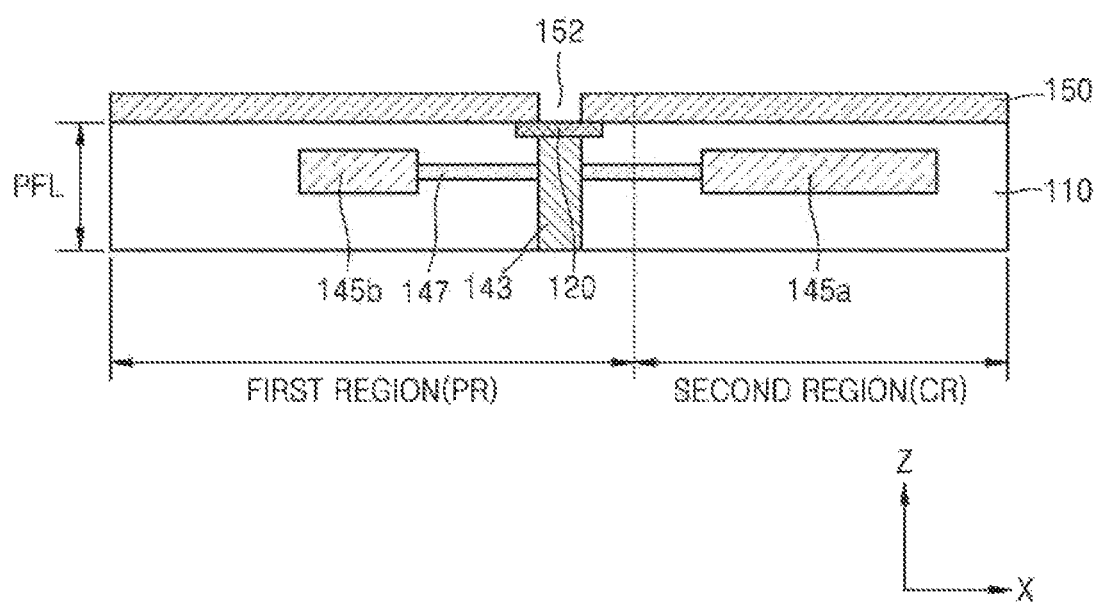
FIGS. 14A to 14C are schematic cross-sectional views illustrating a method of manufacturing a semiconductor chip, according to an exemplary embodiment.
Figure 14B:
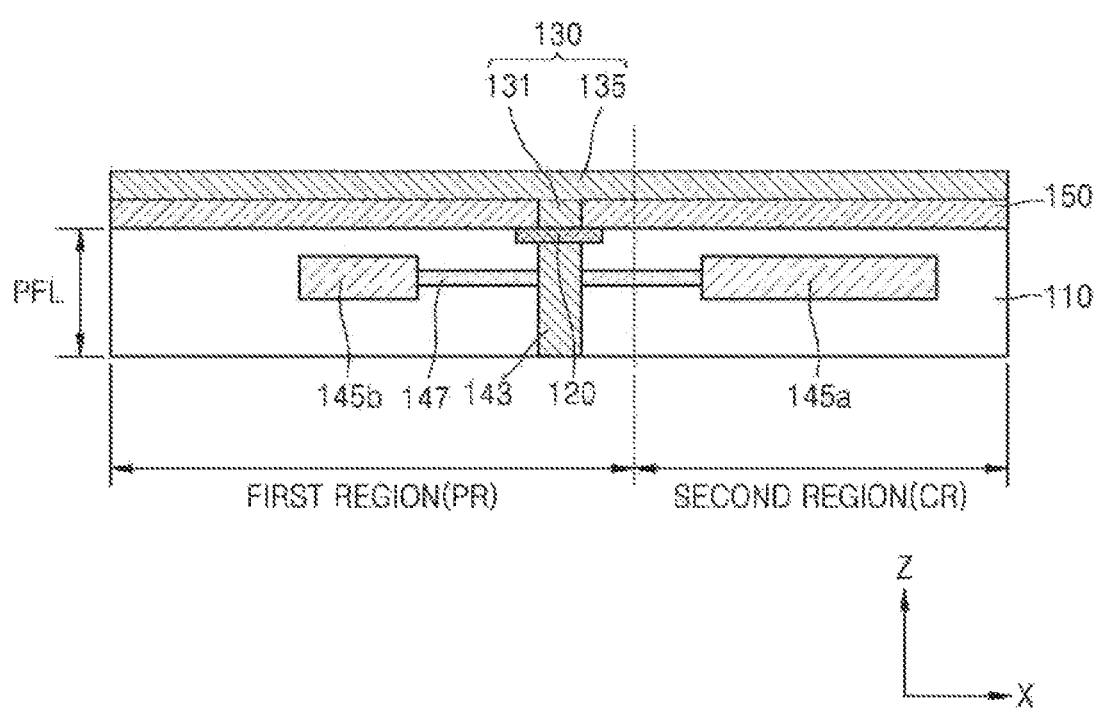
Figure 14C:
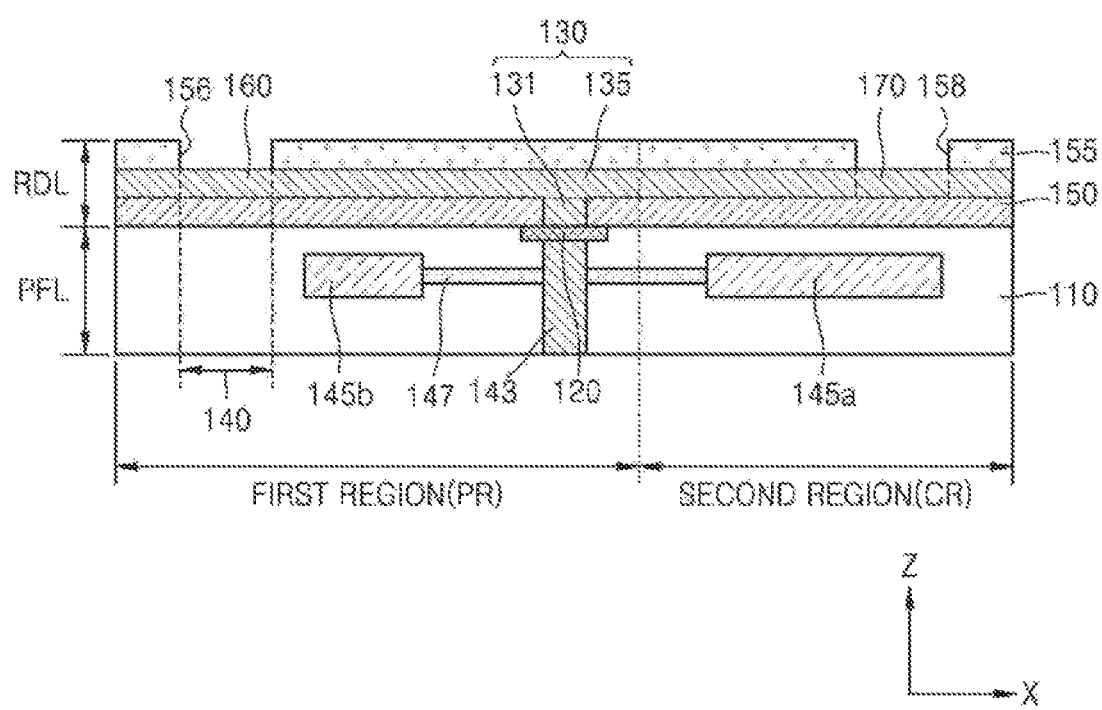

FIGS. 14A to 14C are schematic cross-sectional views illustrating a method of manufacturing a semiconductor chip, according to an exemplary embodiment.

In detail, FIGS. 14A to 14C illustrate an example of a method of manufacturing the semiconductor chip 100 illustrated in FIGS. 1 and 2 described above, and the present embodiment is not limited thereto.

Referring to FIG. 14A, the chip body 110 including the chip pad 120 may be provided. As described above, the chip body 110 may be a semiconductor substrate (for example, a silicon substrate (or a silicon wafer)), the chip via 143, the plurality of internal circuit elements 145a and 145b, and the internal wiring 147. The chip body 110 and the chip pad 120 may be manufactured through a device manufacturing process. The chip pad 120 may be disposed on the chip body 110.

The chip body 110, as described above, may include the first region PR and the second region CR. The first region PR may be a peripheral circuit region including, as the internal circuit element 145b, a control circuit or a control transistor that controls the second region CR. The second region CR may be a core region that includes, as the internal circuit element 145a, a memory cell array storing data.

In the drawing, for convenience of description, the chip pad 120 is illustrated as being disposed in a central portion of the chip body 110. For convenience of description, the chip pad 120 is illustrated as being included in the chip body 110. Also, a longitudinal cross-sectional surface of the chip pad 120 being illustrated in a tetragonal shape is for providing description to easily understand the technical spirit of the inventive concept. As described above, a surface or the entirety of the chip pad 120 may be formed of a conductive material, and for example, may be formed of copper, aluminium, gold, or various metal alloys. Also, an upper surface of the chip body 110 may be covered by silicon oxide. However, this is not illustrated in the drawing so as to easily understand the technical spirit of the inventive concept.

An operation of forming up to the chip pad 120, namely, an operation of forming the chip via 143, the internal circuit elements 145a and 145b, and the internal wiring 147 may be provided through the chip pad forming level PFL.

Subsequently, the first passivation layer 150 including the via hole 152 may be formed on the chip body 110. To provide a detailed description, the first passivation layer 150 may be formed all over the chip body 110. The first passivation layer 150 may be formed of silicon oxide, silicon nitride, and/or the like. The first passivation layer 150 may be formed through various processes, and for example, may be formed through a chemical vapor deposition (CVD) process, a plasma deposition process, and/or the like. Subsequently, the via hole 152 that exposes the chip pad 120 may be formed by patterning the first passivation layer 150.

Referring to FIG. 14B, the redistribution wiring structure 130 may be formed by forming the redistribution wiring layer 135 on the first passivation layer 150 and the redistribution wiring via 131 covering the via hole 152 disposed on the chip pad 120. The redistribution wiring structure 130 may include the redistribution wiring via 131 formed in the via hole 152 of the chip pad 120 and the redistribution wiring layer 135 connected to the redistribution wiring via 131.

The redistribution wiring via 131 and the redistribution wiring layer 135 may be provided as one body. As described above, the redistribution wiring via 131 and the redistribution wiring layer 135 may each be formed of a metal layer, for example, an aluminium layer, a copper layer, a gold layer, or the like. However, a material of each of the redistribution wiring via 131 and the redistribution wiring layer 135 is not limited thereto. The redistribution wiring structure 130 may include the redistribution wiring layer 135 for rewiring of the chip pad 120. The redistribution wiring structure 130 may move a function of the chip pad 120 to a desired region of the chip body 110.

Referring to FIG. 14C, the second passivation layer 155 may be formed on the redistribution wiring layer 135. The second passivation layer 155 may be formed of silicon oxide, silicon nitride, and/or the like. The second passivation layer 155 may be formed through various processes, and for example, may be formed through the CVD process, the plasma deposition process, and/or the like.

Subsequently, the test hole 156 that exposes the redistribution wiring layer 135 in the first region PR of the chip body 110 and the connection hole 158 that exposes the redistribution wiring layer 135 in the second region CR of the chip body 110 may be formed by patterning the second passivation layer 155. Therefore, the redistribution wiring test pad 160 exposed by the test hole 156 and the redistribution wiring connection pad 170 exposed by the connection hole 158 may be formed on the redistribution wiring layer 135.

The redistribution wiring layer 135 may be a dual-use layer for the redistribution wiring test pad 160 and the redistribution wiring connection pad 170. As described above, the first passivation layer 150, the second passivation layer 155, the redistribution wiring structure 130, the redistribution wiring test pad 160, and the redistribution wiring connection pad 170 may be formed on the chip pad 120 by the redistribution wiring forming level RDL.

The internal circuit element 145a including the memory cell array may not be disposed at the lower portion 140 of the redistribution wiring test pad 160 to overlap the lower portion 140. Physical stress is not applied to the internal circuit element 145a including the memory cell array in a testing operation of the semiconductor chip 100, and thus, the reliability of the semiconductor chip 100 may be enhanced.

A connection member (for example, a solder ball, a solder bump, or the like) for connecting the semiconductor chip 100 to an external device (or an external board or a wiring board) may be provided on the redistribution wiring connection pad 170. Therefore, the redistribution wiring connection pad 170 may be formed in a desired region of the chip body 110 by rewiring the chip pad 120, and thus, a degree of freedom of a chip design may be increased, thereby miniaturizing a size of the semiconductor chip 100.

Figure 15:
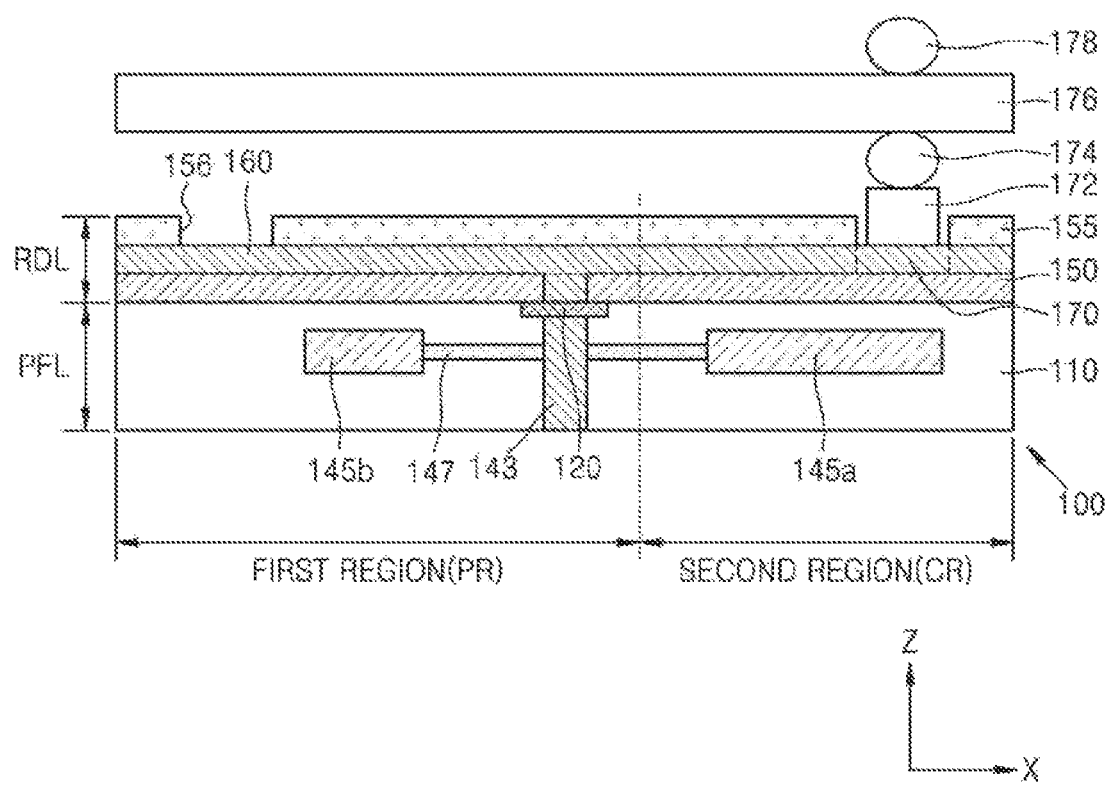
FIG. 15 is a cross-sectional view illustrating a connection relationship between a semiconductor chip and a wiring board according to an exemplary embodiment.

FIG. 15 is a cross-sectional view illustrating a connection relationship between a semiconductor chip and a wiring board according to an exemplary embodiment.

In detail, FIG. 15 illustrates the semiconductor chip 100 of FIGS. 1 and 2 being mounted on a wiring board 176. For convenience of description, the wiring board 176 is illustrated as being disposed on the semiconductor chip 100. In FIG. 15, details described above with reference to FIGS. 1 and 2 are not repeated or will be briefly described for convenience of description.

A connection member 172 for electrically connecting the semiconductor chip 100 to an external device (or a wiring board) may be disposed on the redistribution wiring connection pad 170 of the semiconductor chip 100. The connection member 172 may include a bump. Depending on the case, a bonding wire may be provided without the connection member 172 being disposed on the redistribution wiring connection pad 170, and thus, the semiconductor chip 100 may be connected to the external device. The semiconductor chip 100 where the connection member 172 is provided may be mounted on a connector land 174 of the wiring board 176. An external connection member 178 (for example, a solder ball) may be provided on one surface of the wiring board 176.

The redistribution wiring connection pad 170 may be referred to as redistribution wiring lands, or may be understood as a compatible element. If the redistribution wiring connection pad 170 are the redistribution wiring lands, the redistribution wiring connection pad 170 may be a solder land, a bump land, and/or a wire land. For example, if the redistribution wiring connection pad 170 is an element where a solder ball is provided or which is capable of contacting the solder ball, the redistribution wiring connection pad 170 may be referred to as a redistribution wiring solder land. Alternatively, if the redistribution wiring connection pad 170 is an element where a bump is provided or which is capable of contacting the bump, the redistribution wiring connection pad 170 may be referred to as a redistribution wiring hump land, and if the redistribution wiring connection pad 170 is an element where a bonding wire is provided or which is capable of contacting the bonding wire, the redistribution wiring connection pad 170 may be referred to as a redistribution wiring bonding pad or a redistribution wiring wire land. The terms may be named based on a function of the redistribution wiring connection pad 170, and thus, it may be known that there are no technical and structural differences.

Figure 16:
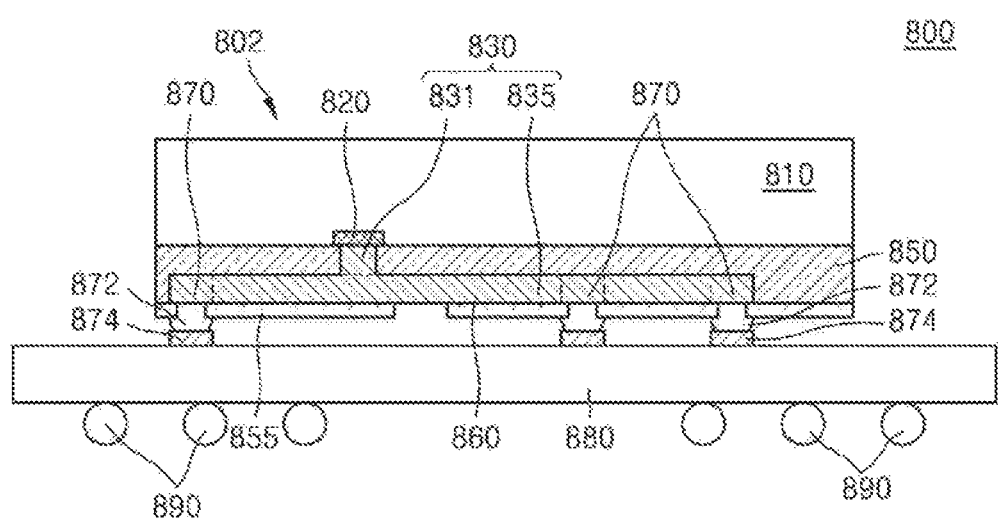
FIGS. 16 and 17 are cross-sectional views for describing a semiconductor package including a semiconductor chip according to an exemplary embodiment.
Figure 17:
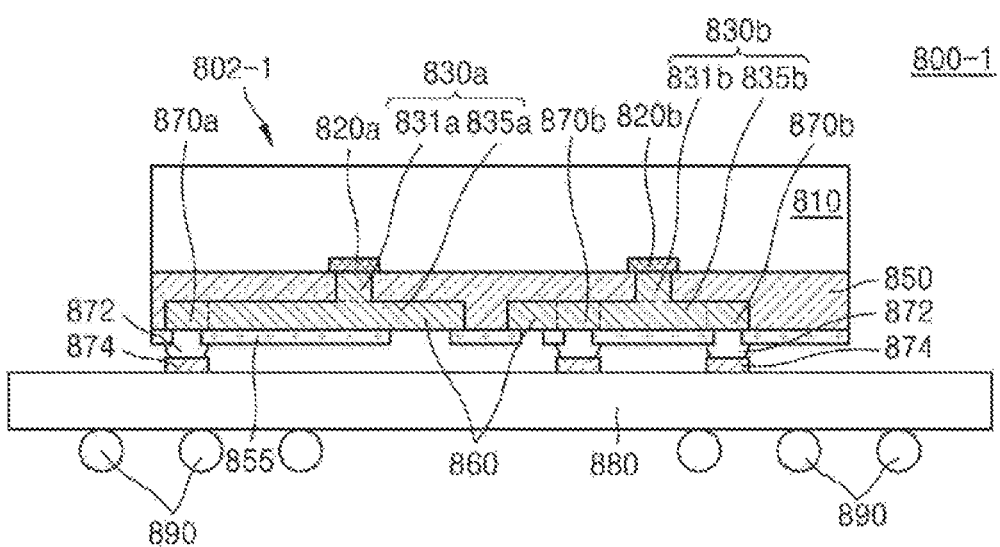

FIGS. 16 and 17 are cross-sectional views for describing a semiconductor package including a semiconductor chip according to an exemplary embodiment.

In detail, a semiconductor package 800 (800-1) may include a package board (a wiring board) 880 including a plurality of connector lands (connection lands) 874, a semiconductor chip 802 (802-1) disposed on the package hoard 880, and a connection member 872 that electrically connects the package board 880 to the semiconductor chip 802 (802-1).

The semiconductor chip 802 (802-1) according to an exemplary embodiment may be one of the above-described semiconductor chips 100, 100-1, 100-2 and 200 to 700. In the semiconductor chip 802 illustrated in FIG. 16, one chip pad 820 is illustrated in a cross-sectional view. In the semiconductor chip 802-1 illustrated in FIG. 17, two chip pads 820a and 820b are illustrated in a cross-sectional view. The chip pad 820 of FIG. 16 and the chip pads 820a and 820b of FIG. 17 are illustrated for convenience, and the present embodiment is not limited to the number of chip pads represented by the chip pads 820, 820a and 820b.

In the semiconductor chip 802 (802-1), the chip pad 820 (820a and 820b) may be disposed on one surface of a chip body 810. The chip pad 820 (820a and 820b) may correspond to reference numeral 120 of FIGS. 1 to 14 and may correspond to reference numeral 220 of FIGS. 6 to 8.

The connection member 872 may electrically connect the connector land 874 of the package hoard 880 to a redistribution wiring structure 830 (830a and 830b) of the semiconductor chip 802 (802-1). The redistribution wiring structure 830 (830a and 830b) may include a redistribution wiring via 831 (831a and 831b) and a redistribution wiring layer 835 (835a and 835b), which are disposed on the chip pad 820 (820a and 820b). In FIGS. 16 and 17, reference number 850 refers to a first passivation layer, and reference numeral 855 refers to a second passivation layer.

The redistribution wiring structure 830 (830a and 830b) may correspond to reference numeral 130 of FIGS. 1 to 4 and may correspond to reference numeral 230 of FIGS. 6 to 8. The redistribution wiring via 831 (831a and 831b) may correspond to reference numeral 131 of FIGS. 1 to 4 and may correspond to reference numeral 231 of FIGS. 6 to 8. The redistribution wiring layer 835 (835a and 835b) may correspond to reference numeral 135 of FIGS. 1 to 4 and may correspond to reference numeral 235 of FIGS. 6 to 8.

The redistribution wiring layer 835 (835a and 835b) may include a redistribution wiring test pad 860 and a redistribution wiring connection pad 870 (870a and 870b). The redistribution wiring test pad 860 may correspond to reference numeral 160 of FIGS. 1 to 4 and may correspond to reference numeral 260 of FIGS. 6 to 8. The redistribution wiring connection pad 870 (870a and 870b) may correspond to reference numeral 170 of FIGS. 1 to 4 and may correspond to reference numeral 270 of FIGS. 6 to 8.

The connector lands 874 of the package board 880 may be an element electrically connected to the semiconductor chip 802 (802-1). The connector lands 874 may be aligned with the redistribution wiring connection pad 870 (870a and 870b) of the semiconductor chip 802 (802-1). The package board 880 may further include a module board, which is disposed on a surface opposite to another surface on which the semiconductor chip 802 (802-1) is disposed, or a conductive ball 890 electrically connected to a system board. The conductive ball 890 may be, for example, at least one solder ball.

The connection member 872 (for example, a bump) may be formed of metal, for example, aluminum, nickel, solder, gold, silver, and/or the like. The chip pad 820 (820a and 820b) of the semiconductor chip 802 (802-1) may be electrically connected to the connector lands 874 of the package board 880 through the redistribution wiring structure 830 (830a and 830b) and the connection member 872. In FIGS. 16 and 17, a molding material is omitted for easily understanding the technical spirit of the inventive concept.

Figure 18:
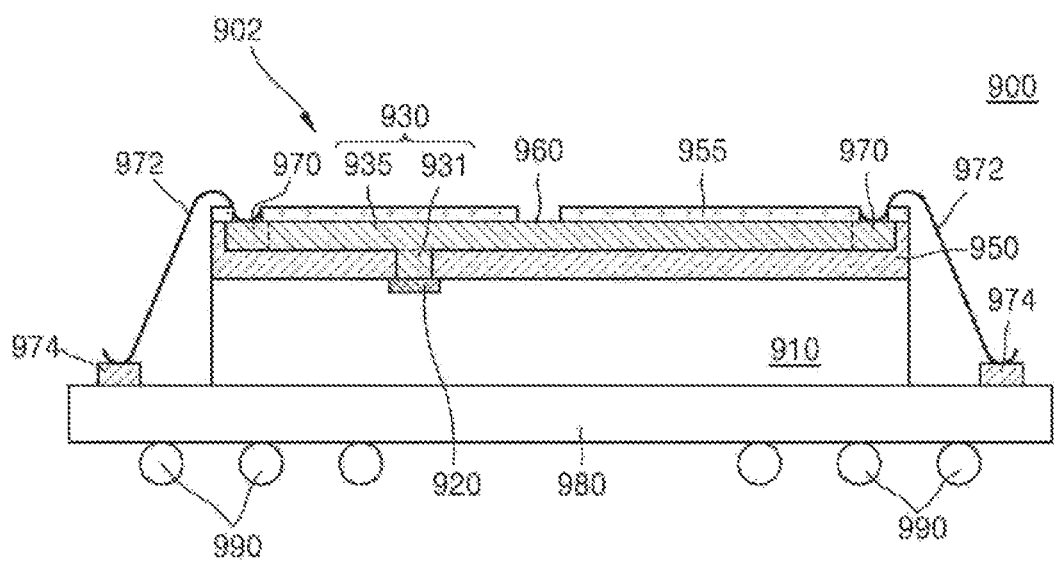
FIGS. 18 and 19 are cross-sectional views for describing a semiconductor package including a semiconductor chip according to an exemplary embodiment.
Figure 19:
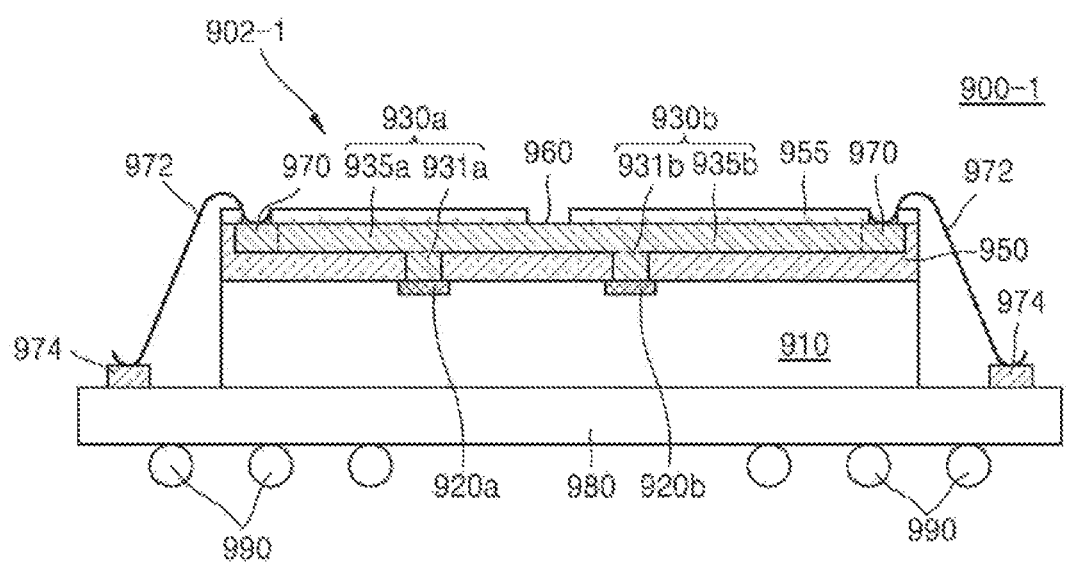

FIGS. 18 and 19 are cross-sectional views for describing a semiconductor package including a semiconductor chip according to an exemplary embodiment.

In detail, a semiconductor package 900 (900-1) may include a package board (i.e., a wiring board) 980 including a wire pad 974, a semiconductor chip 902 (902-1) disposed on the package board 980, and a bonding wire 972 that electrically connects the package board 980 to the semiconductor chip 902 (902-1).

The semiconductor chip 902 (902-1) according to an exemplary embodiment may be one of the above-described semiconductor chips 100, 100-1, 100-2 and 200 to 700. In the semiconductor chip 902 illustrated in FIG. 18, one chip pad 920 is illustrated. In the semiconductor chip 902-1 illustrated in FIG. 19, two chip pads 920a and 920b are illustrated. The chip pad 920 of FIG. 18 and the chip pads 920a and 920b of FIG. 19 are illustrated for convenience, and the present embodiment is not limited to the number of chip pads represented by the chip pads 920, 920a and 920b.

In the semiconductor chip 902 (902-1), the chip pad 920 (920a and 920b) may be disposed on one surface of a chip body 910. The chip pad 920 (920a and 920b) may correspond to reference numeral 120 of FIGS. 1 to 14 and may correspond to reference numeral 220 of FIGS. 6 to 8.

The bonding wire 972 may electrically connect the wire pad 974 of the package board 980 to a redistribution wiring structure 930 (930a and 930b) of the semiconductor chip 902 (902-1). The redistribution wiring structure 930 (930a and 930b) may include a redistribution wiring via 931 (931a and 931b) and a redistribution wiring layer 935 (935a and 935b), which are disposed on the chip pad 920 (920a and 920b). In FIGS. 18 and 19, reference number 950 refers to a first passivation layer, and reference numeral 955 refers to a second passivation layer.

The redistribution wiring structure 930 (930a and 930b) may correspond to reference numeral 130 of FIGS. 1 to 4 and may correspond to reference numeral 230 of FIGS. 6 to 8. The redistribution wiring via 931 (931a and 931b) may correspond to reference numeral 131 of FIGS. 1 to 4 and may correspond to reference numeral 231 of FIGS. 6 to 8. The redistribution wiring layer 935 (935a and 935b) may correspond to reference numeral 135 of FIGS. 1 to 4 and may correspond to reference numeral 235 of FIGS. 6 to 8.

The redistribution wiring layer 935 (935*a* and 935*b*) may include a redistribution wiring test pad 960 and a redistribution wiring connection pad 970. The redistribution wiring test pad 960 may correspond to reference numeral 160 of FIGS. 1 to 4 and may correspond to reference numeral 260 of FIGS. 6 to 8. The redistribution wiring connection pad 970 may correspond to reference numeral 170 of FIGS. 1 to 4 and may correspond to reference numeral 270 of FIGS. 6 to 8.

The wire pad 974 of the package board 980 may be an element electrically connected to the semiconductor chip 902 (902-1). The wire land 974 may be disposed in an outer portion of one surface of the package board 980 on which the semiconductor chip 902 (902-1) is disposed. The package board 980 may further include a module board, which is disposed on a surface opposite to another surface on which the semiconductor chip 902 (902-1) is disposed, or a conductive ball 990 electrically connected to a system board. The conductive hall 990 may be, for example, at least one solder ball.

The bonding wire 972 may be formed of metal, and particularly, may be formed of gold (Au), which is good in flexibility and conductivity. The chip pad 920 (920*a* and 920*b*) of the semiconductor chip 902 (902-1) may be electrically connected to the wire pad 974 of the package board 980 through the redistribution wiring structure 930 (930*a* and 930*b*) and the bonding wire 972. In FIGS. 18 and 19, a molding material may be formed to cover the package board 980 and the semiconductor chip 902 (902-1).

Figure 20A:
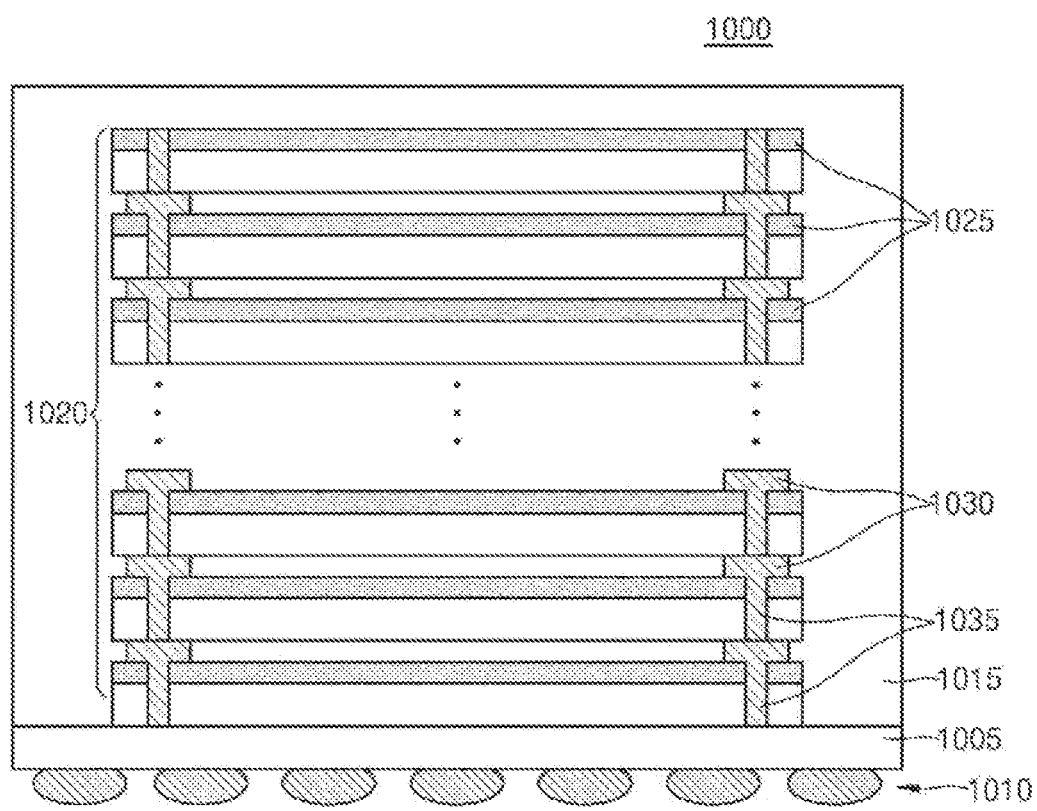
FIG. 20A is a cross-sectional view schematically illustrating a wafer stacked package including a semiconductor chip according to an exemplary embodiment.
Figure 20B:
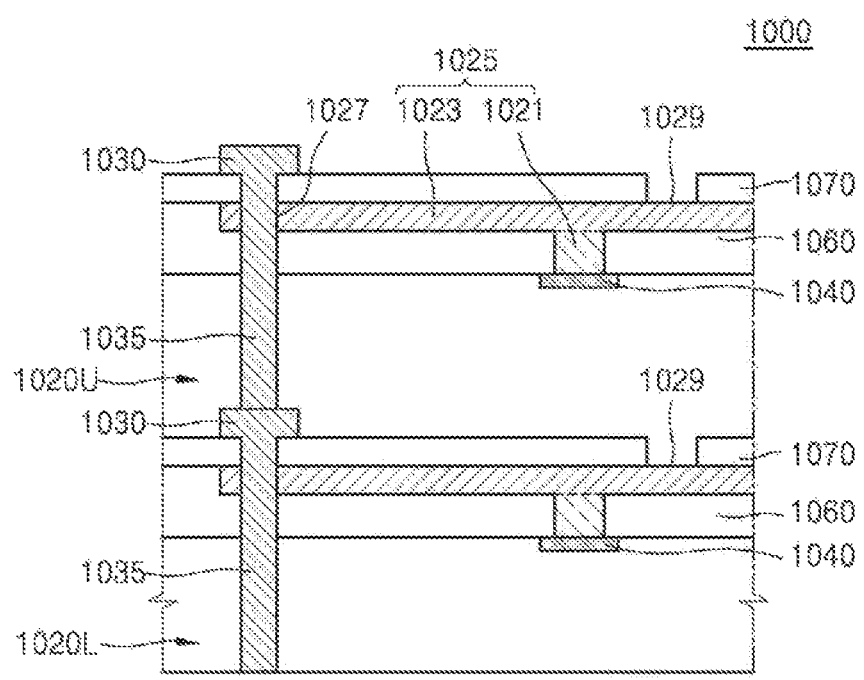
FIG. 20B is an enlarged view of a portion of FIG. 20A.

FIG. 20A is a cross-sectional view schematically illustrating a wafer stacked package 1000 including a semiconductor chip according to an exemplary embodiment, and FIG. 20B is an enlarged view of a portion of FIG. 20A.

In detail, the wafer stacked package 1000 may include a package hoard 1005, a plurality of semiconductor packages 1020 stacked on a top of the package board 1005, a molding material 1015 that seals the semiconductor chips 1020, and a plurality of, for example, solder balls 1010 disposed on a bottom of the package board 1005. The stacked plurality of semiconductor chips 1020 may each include a redistribution wiring structure 1025 and a through via 1035.

The through via 1035 may vertically pass through a plurality of wafers (i.e., chip bodies) 1020L and 1020U, and thus may be a silicon through-via. The through via 1035 may include a through-via pad 1030. The through-via pad 1030 may denote an element having a cross-sectional area broader than that of the through via 1035. The through-via pad 1030 and the through via 1035 may be provided as one body. The through via 1035 may vertically contact the through-via pad 1030. In other words, the stacked semiconductor chips 1020 may be connected physically, electrically, and vertically connected to the through via 1035 and the through-via pad 1030.

The through via 1035 may be physically and electrically connected to the redistribution wiring structure 1025 of each of the semiconductor chips 1020. The through via 1035 may be formed at an end of the redistribution wiring structure 1025 and may pass through the redistribution wiring structure 1025.

The redistribution wiring structure 1025 will be described with reference to FIG. 20B. In FIG. 20B, reference numeral 1020U refers to a chip body of an upper semiconductor chip 1020, and reference numeral 1020L refers to a chip body of a lower semiconductor chip 1020.

The redistribution wiring structure 1025 may include a redistribution wiring via 1021 and a redistribution wiring layer 1023, which are disposed on the chip pad 1040. In FIG. 20B, reference number 1060 refers to a first passivation layer, and reference numeral 1070 refers to a second passivation layer. The redistribution wiring via 1021 may correspond to reference numeral 131 of FIGS. 1 to 4 and may correspond to reference numeral 231 of FIGS. 6 to 8. The redistribution wiring layer 1023 may correspond to reference numeral 135 of FIGS. 1 to 4 and may correspond to reference numeral 235 of FIGS. 6 to 8.

The redistribution wiring layer 1023 may include a redistribution wiring test pad 1029 and a redistribution wiring connection pad 1027. The redistribution wiring test pad 1029 may correspond to reference numeral 160 of FIGS. 1 to 4 and may correspond to reference numeral 260 of FIGS. 6 to 8. The redistribution wiring connection pad 1027 may correspond to reference numeral 170 of FIGS. 1 to 4 and may correspond to reference numeral 270 of FIGS. 6 to 8.

Figure 21:
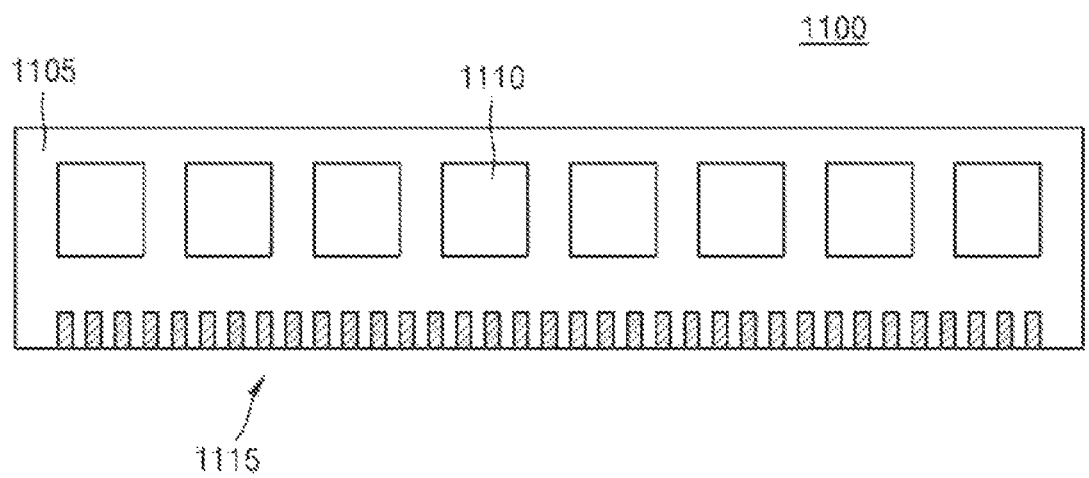
FIG. 21 is a plan view schematically illustrating a semiconductor module according to an exemplary embodiment.

FIG. 21 is a plan view schematically illustrating a semiconductor module 1100 according to an exemplary embodiment.

In detail, the semiconductor module 1100 according to an exemplary embodiment may include a module board 1005, a plurality of semiconductor packages 1110 disposed on the module board 1105, and a plurality of module contact terminals 1115 that are arranged in parallel on one edge of the module board 1105 and are electrically connected to the semiconductor packages 1110.

The module board 1105 may be a printed circuit board (PCB). Both surfaces of the module board 1105 may be all used. That is, the semiconductor packages 1110 may be disposed on a front surface and a rear surface of the module board 1105. Eight semiconductor packages 1110 are illustrated as being disposed on the front surface of the module board 1105, but this is merely an example. The semiconductor module 1100 may further include a separate semiconductor package for controlling the semiconductor packages 1110.

At least one of the semiconductor packages 1110 may include the above-described semiconductor chips or semiconductor packages according to the exemplary embodiments. The module contact terminals 1115 may each be formed of metal and/or the like and may have oxidation resistance. The module contact terminals 1115 may be variously set according to the standard of the semiconductor module 1100. Therefore, the number of the illustrated module contact terminals 1115 may not have a special meaning.

Figure 22:
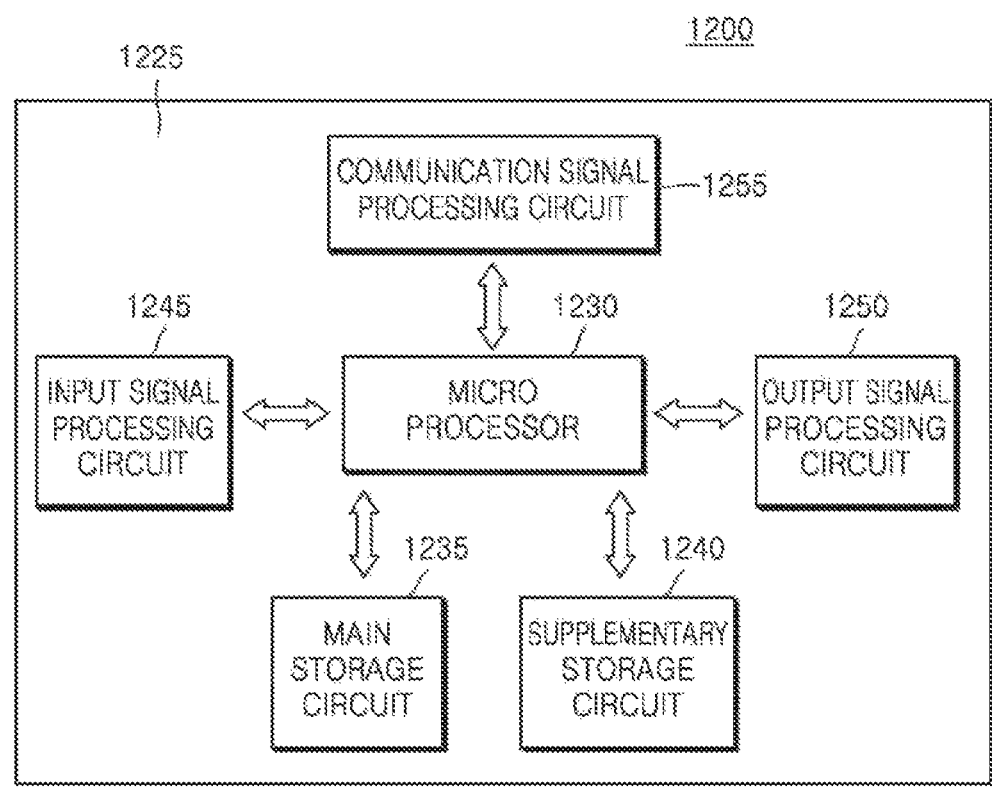
FIG. 22 is a block diagram schematically illustrating an electronic circuit board according to an exemplary embodiment.

FIG. 22 is a block diagram schematically illustrating an electronic circuit board 1200 according to an exemplary embodiment.

In detail, the electronic circuit board 1200 may include a microprocessor 1230 disposed on a circuit board 1225, a main storage circuit 1235 and a supplementary storage circuit 1240 that communicate with the microprocessor 1230, an input signal processing circuit 1245 that transfers a command to the microprocessor 1230, an output signal processing circuit 1250 that receives a command from the microprocessor 1230, and a communication signal processing unit 1255 that exchanges an electrical signal with other circuit boards. It may be understood that each of arrows refers to a path through an electrical signal is transferred.

The microprocessor 1230 may receive and process various electrical signals to output a result of the processing and may control the other elements of the electronic circuit board 1200. It may be understood that the microprocessor 1230 is, for example, a central processing unit (CPU) and a main control unit (MCU).

The main storage circuit 1235 may temporarily store data, which is always or frequently required by the microprocessor 1230, before-processing data, and after-processing data. The main storage circuit 1235 may need a fast response, and thus may be configured with a semiconductor memory chip. In detail, the main storage circuit 1235 may be a semiconductor memory called a cache. The main storage circuit 1235 may be configured with static random access memory (SRAM), dynamic random access memory (DRAM), resistive random access memory (RRAM), and application semiconductor memories thereof (for example, a utilized RAM, a Ferro-electric RAM, a fast cycle RAM, a phase changeable RAM, a magnetic RAM, and/or the like) or may be configured with other semiconductor memories.

In addition, the main storage circuit 1235 may include a random access memory (RAM) irrespective of volatility/non-volatility. In the present embodiment, the main storage circuit 1235 may include one or more semiconductor chips, semiconductor packages, or semiconductor modules according to the exemplary embodiments. The supplementary storage circuit 1240 may be a large-capacity storage element and may be configured with a nonvolatile semiconductor memory, such as flash memory or the like, or a hard disk drive using a magnetic field. Alternatively, the supplementary storage circuit 1240 may be configured with a compact disk drive using light. Although the supplementary storage circuit 1240 does not desire a fast speed in comparison with the main storage circuit 1235, the supplementary storage circuit 1240 may be applied to a case of desiring to store large-scale data. The supplementary storage circuit 1240 may include a nonvolatile storage element irrespective of random/nonrandom.

The supplementary storage circuit 1240 may include the semiconductor chip, the semiconductor package, or the semiconductor module according to the exemplary embodiments disclosed herein. The input signal processing circuit 1245 may convert an external command into an electrical signal or may transfer an electrical signal, transferred from the outside, to the microprocessor 1230.

A command or an electrical signal transferred from the outside may be an operation command, an electrical signal that is to be processed, or data that are to be stored. The input signal processing circuit 1245 may be a terminal signal processing circuit that processes a signal transmitted from a keyboard, a mouse, a touch pad, an image recognition device, or various sensors, an image signal processing circuit that processes an image signal transferred from a scanner or a camera, various sensors, an input signal interface, or the like. The input signal processing circuit 1245 may include the semiconductor chip, the semiconductor package, or the semiconductor module according to the exemplary embodiments disclosed herein.

The output signal processing circuit 1250 may be an element for transmitting an electrical signal, generated through processing by the microprocessor 1230, to the outside. For example, the output signal processing circuit 1250 may be a graphic card, an image processor, an optical converter, a beam panel card, one of various functional interface circuits, or the like. The output signal processing circuit 1250 may include the semiconductor chip, the semiconductor package, or the semiconductor module according to the exemplary embodiments disclosed herein.

The communication circuit 1255 may be an element for directly exchanging an electrical signal with other electronic systems or other circuit boards without undergoing the input signal processing circuit 1245 or the output signal processing circuit 1250. For example, the communication circuit 1255 may include a modem, a LAN card, various interfaces, and/or the like of a personal computer (PC) system. The communication circuit 1255 may include the semiconductor chip, the semiconductor package, or the semiconductor module according to the exemplary embodiments disclosed herein.

Figure 23:
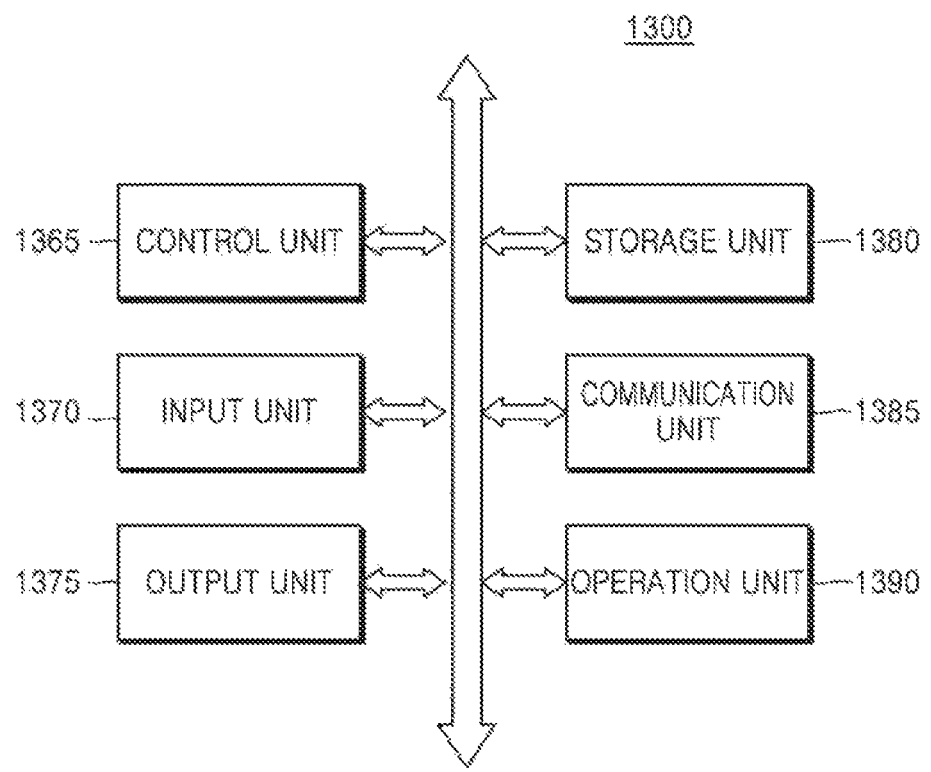
FIG. 23 is a block diagram schematically illustrating an electronic system according to an exemplary embodiment.

FIG. 23 is a block diagram schematically illustrating an electronic system 1300 according to an exemplary embodiment disclosed herein.

In detail, the electronic system 1300 according to an exemplary embodiment may include a control unit 1365, an input unit 1370, an output unit 1375, and a storage unit 1380. Also, the electronic system 1300 may further include a communication unit 1385 and/or an operation unit 1390.

The control unit 1365 may overall control the electronic system 1300 and elements. The control unit 1365 may be understood as a CPU or a central control unit, and may include the electronic circuit board 1200 (see FIG. 22) according to an exemplary embodiment disclosed herein. Also, the control unit 1365 may include the semiconductor chip, the semiconductor package, or the semiconductor module according to the exemplary embodiments disclosed herein.

The input unit 1370 may transfer an electrical command signal to the control unit 1365. The input unit 1370 may be a keyboard, a keypad, a touch pad, an image recognizer such as a scanner, or various input sensors. The input unit 1370 may include the semiconductor chip, the semiconductor package, or the semiconductor module according to the exemplary embodiments disclosed herein.

The output unit 1375 may receive the electrical command signal from the control unit 1365 to output a result of processing by the electronic system 1300. The output unit 1375 may be a monitor, a printer, a beam irradiator, or one of various mechanical devices. The output unit 1375 may include the semiconductor chip, the semiconductor package, or the semiconductor module according to the exemplary embodiments disclosed herein.

The storage unit 1380 may be an element for temporarily or permanently storing an electrical signal, which is to be processed by the control unit 1165, and an electrical signal generated through processing by the control unit 1165. The storage unit 1380 may be physically or electrically connected or coupled to the control unit 1365. The storage unit 1380 may be a semiconductor memory, a magnetic storage device such as a hard disk or the like, an optical storage device such as a compact disk or the like, a server having a data storing function, or the like. Also, the storage unit 1380 may include the semiconductor chip, the semiconductor package, or the semiconductor module according to the exemplary embodiments disclosed herein.

The communication unit 1385 may receive an electrical command signal from the control unit 1365 and may transfer the electrical command signal to another electronic system, or may receive an electrical command signal from the other electronic system. The communication unit 1385 may be a modem, a wired transmission/reception device such as an LAN card, a wireless transmission/reception device such as a Wibro interface, an infrared port, or the like. Also, the communication unit 1385 may include the semiconductor chip, the semiconductor package, or the semiconductor module according to the exemplary embodiments disclosed herein.

The operation unit 1390 may perform a physical or mechanical operation according to a command of the control unit 1365. For example, the operation unit 1390 may be an element, which performs a mechanical operation, such as a plotter, an indicator, an up/down operation, or the like. The electronic system 1300 according to an exemplary embodiment may include a computer, a network server, a networking printer, or a scanner, a wireless controller, a mobile communication terminal, an exchanger, an electronic device performs a programmed operation, and/or the like.

Moreover, the electronic system 1300 may be applied to mobile phones, MP3 players, navigation devices, portable multimedia players (PMPs), solid state disks (SSDs), household appliances, etc.

As described above, in the semiconductor chip according to the exemplary embodiments, the redistribution wiring test pad electrically connected to the chip pad and the redistribution wiring connection pad electrically connected to the chip pad may be arranged spaced apart from each other on the chip body, thereby enhancing a degree of freedom of a chip design.

Moreover, in the semiconductor chip according to the exemplary embodiments, since internal circuit elements are not disposed under the redistribution wiring test pad, physical stress is not applied to the internal circuit elements when testing whether a chip is good or defective, thereby enhancing reliability.

While the inventive concept has been particularly shown and described with reference to exemplary embodiments thereof, it will be understood that various changes in form and details may be made therein without departing from the spirit and scope of the following claims.

What is claimed is:

1. A semiconductor chip, comprising:
    a plurality of chip pads disposed in a first region of a chip body, the plurality of chip pads being spaced apart in a first direction and in a second direction, which is substantially opposite to the first direction in a plan view;
    a redistribution wiring test pad disposed in the first region of the chip body, spaced apart from the plurality of chip pads;
    a redistribution wiring connection pad disposed in a second region of the chip body;
    a redistribution wiring layer electrically connected to the plurality of chip pads, wherein the plurality of chip pads, the redistribution wiring test pad and the redistribution wiring connection pad are sequentially connected to the same redistribution wiring layer in the first direction in the plan view; and
    an internal circuit element including a memory cell array, wherein the internal circuit element is not vertically overlapped by a lower portion of the redistribution wiring test pad in the first region of the chip body,
    wherein the redistribution wiring test pad is positioned at a different height from the plurality of chip pads in a direction perpendicular to a plane of the semiconductor chip.

2. The semiconductor chip of claim 1, wherein the plurality of chip pads, the redistribution wiring test pad and the redistribution wiring connection pad are directly connected to the same redistribution wiring layer in the first direction in the plan view.

3. The semiconductor chip of claim 1, wherein the redistribution wiring layer extends on the chip body in the first direction from the plurality of chip pads to an edge portion of the chip body, and the redistribution wiring layer is a single continuous metal layer in the plan view.

4. The semiconductor chip of claim 1, further comprising a bonding wire that electrically connects the redistribution wiring connection pad to a package board.

5. The semiconductor chip of claim 1, further comprising a redistribution wiring via connected to the plurality of chip pads and the redistribution wiring layer.

6. The semiconductor chip of claim 1, wherein the plurality of chip pads and the redistribution wiring test pad are disposed in a central portion of the chip body.

7. The semiconductor chip of claim 1, wherein the redistribution wiring connection pad is disposed in a near-edge portion of the chip body.

8. The semiconductor chip of claim 1, wherein the redistribution wiring test pad is spaced apart from the plurality of chip pads in the first and second directions in the plan view.

9. A semiconductor chip, comprising:
    a chip body having at least two chip pads thereon;
    at least one redistribution wiring test pad in a first region of the chip body, each of the at least one redistribution wiring test pad being spaced apart from each of the at least two chip pads in a plan view;
    at least one redistribution wiring connection pad in a second region of the chip body, the second region being different from the first region, each redistribution wiring connection pad being spaced apart from each of the at least two chip pads in the plan view;
    at least one redistribution wiring structure, each of the at least one redistribution wiring structure electrically connected to each of the at least two chip pads, wherein a redistribution wiring test pad of the at least one redistribution wiring test pad corresponding to one of the at least two chip pads and the redistribution wiring connection pad corresponding to the other of the at least two chip pads are directly connected to the same redistribution wiring structure; and
    a memory cell array, wherein the memory cell array is not vertically overlapped by a lower portion of the at least one redistribution wiring test pad in the first region of the chip body;
    wherein the at least one redistribution wiring structure includes a redistribution wiring layer, and the redistribution wiring layer extends on the chip body in a first direction from each of the at least two chip pads to an edge portion of the chip body,
    the at least one redistribution wiring test pad is disposed between each of the at least two chip pads and the at least one redistribution wiring connection pad in the first direction, the redistribution wiring layer is a single continuous metal layer, and
    the at least one redistribution wiring test pad is positioned at a different height from the at least two chip pads in a direction perpendicular to a plane of the semiconductor chip.

10. The semiconductor chip of claim 9, wherein the at least one redistribution wiring test pad is positioned without overlapping any chip pad of the semiconductor chip in the plan view.

11. The semiconductor chip of claim 9, wherein each of the at least one redistribution wiring connection pad is spaced apart from the redistribution wiring test pad in the plan view.

12. The semiconductor chip of claim 9, further comprising at least one redistribution wiring via connected to each of the at least two chip pads and the redistribution wiring layer, and the at least one redistribution wiring test pad and the at least one redistribution wiring connection pad are disposed in a near-edge portion of the chip body.

13. The semiconductor chip of claim 9, further comprising a bonding wire that electrically connects the at least one redistribution wiring connection pad to a package board.

14. The semiconductor chip of claim 9, wherein the at least two chip pads and the at least one redistribution wiring test pad are disposed in a central portion of the chip body.

15. The semiconductor chip of claim 9, wherein the at least one redistribution wiring connection pad is disposed in the edge portion of the chip body.

16. A semiconductor chip, comprising:
a package board;
a chip body on the package board, the chip body having at least two chip pads thereon;
at least one redistribution wiring test pad in a first region of the chip body, each of the at least one redistribution wiring test pad being spaced apart from each of the at least two chip pads in a plan view;
at least one redistribution wiring connection pad in a second region of the chip body, the second region being different from the first region, each redistribution wiring connection pad being spaced apart from each of the at least two chip pads in the plan view;
at least one redistribution wiring structure, each of the at least one redistribution wiring structure electrically connected to each of the at least two chip pads, wherein a redistribution wiring test pad of the at least one redistribution wiring test pad corresponding to one of the at least two chip pads and the redistribution wiring connection pad corresponding to the other of the at least two chip pads are directly connected to the same redistribution wiring structure;
a memory cell array, wherein the memory cell array is not vertically overlapped by a lower portion of the at least one redistribution wiring test pad in the first region of the chip body; and
a bonding wire that electrically connects the at least one redistribution wiring connection pad to the package board,
wherein the at least one redistribution wiring structure includes a redistribution wiring layer, and the redistribution wiring layer extends on the chip body in a first direction from each of the at least two chip pads to an edge portion of the chip body, and
the at least one redistribution wiring test pad is disposed between each of the at least two chip pads and the at least one redistribution wiring connection pad in the first direction, the redistribution wiring layer is a single continuous metal layer.

17. The semiconductor chip of claim 16, wherein the at least one redistribution wiring test pad is positioned without overlapping any chip pad of the semiconductor chip in the plan view.

18. The semiconductor chip of claim 16, wherein each of the at least one redistribution wiring connection pad is spaced apart from the redistribution wiring test pad in the plan view.

19. The semiconductor chip of claim 16, further comprising at least one redistribution wiring via connected to each of the at least two chip pads and the redistribution wiring layer, and
the at least one redistribution wiring test pad and the at least one redistribution wiring connection pad are disposed in a near-edge portion of the chip body.

20. The semiconductor chip of claim 16, wherein the at least one redistribution wiring test pad is positioned at a different height from the at least two chip pads in a direction perpendicular to a plane of the semiconductor chip.

* * * * *